(12) United States Patent
Yamamoto

(10) Patent No.: US 12,272,627 B2
(45) Date of Patent: Apr. 8, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hiroshi Yamamoto, Minato (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 567 days.

(21) Appl. No.: 17/653,308

(22) Filed: Mar. 3, 2022

(65) Prior Publication Data

US 2023/0091854 A1  Mar. 23, 2023

(30) Foreign Application Priority Data

Sep. 22, 2021  (JP) .................... 2021-154765

(51) Int. Cl.
*H01L 23/495* (2006.01)
*H02M 3/335* (2006.01)
*H02M 7/5387* (2007.01)

(52) U.S. Cl.
CPC .... *H01L 23/49575* (2013.01); *H01L 23/4951* (2013.01); *H01L 23/49562* (2013.01); *H02M 3/33571* (2021.05); *H02M 3/33573* (2021.05); *H02M 3/33576* (2013.01); *H02M 7/5387* (2013.01)

(58) Field of Classification Search
CPC .......... H01L 23/4951; H01L 23/49575; H01L 23/495; H02M 7/5387

USPC ........................................... 257/666
See application file for complete search history.

(56) References Cited

U.S. PATENT DOCUMENTS

| 6,589,859 | B2 | 7/2003 | Petitbon et al. |
| 8,513,784 | B2 * | 8/2013 | Lu ............ H01L 24/40 257/723 |
| 9,024,423 | B2 | 5/2015 | Muto et al. |
| 9,966,330 | B2 * | 5/2018 | Terrill ............ H01L 24/41 |
| 10,546,840 | B2 * | 1/2020 | Terrill ............ H01L 23/49513 |
| 2002/0093094 | A1 * | 7/2002 | Takagawa ......... H01L 23/49575 257/E23.044 |
| 2006/0169976 | A1 | 8/2006 | Kameda et al. |

(Continued)

FOREIGN PATENT DOCUMENTS

JP  2002-093977 A  3/2002
JP  2004-342880 A  12/2004

(Continued)

OTHER PUBLICATIONS

Office Action issued in Japanese Patent Application No. 2021-154765 dated Oct. 15, 2024 in 7 pages.

*Primary Examiner* — Nitin Parekh
(74) *Attorney, Agent, or Firm* — Knobbe Martens Olson & Bear LLP

(57) ABSTRACT

A semiconductor device comprising a DC-DC converter including a primary-side circuit and a secondary-side circuit including a first semiconductor package accommodating a first semiconductor element group including a first semiconductor element and a second semiconductor element. The first semiconductor element and the second semiconductor element are stacked. The first semiconductor element group is a MOSFET, an IGBT, or a diode.

7 Claims, 29 Drawing Sheets

(56) References Cited

U.S. PATENT DOCUMENTS

| | | | | |
|---|---|---|---|---|
| 2006/0175700 A1* | 8/2006 | Kagii | ...................... | H01L 23/24 |
| | | | | 257/E23.044 |
| 2007/0228534 A1* | 10/2007 | Uno | ........................ | H01L 24/48 |
| | | | | 257/E23.079 |
| 2019/0259690 A1 | 8/2019 | Kawashima | | |
| 2020/0035656 A1* | 1/2020 | Miyazaki | ................ | H01L 24/40 |
| 2020/0295667 A1 | 9/2020 | Takegami | | |
| 2020/0365491 A1 | 11/2020 | Kawashima | | |
| 2022/0321018 A1* | 10/2022 | Nakakohara | .......... | H02M 1/327 |

FOREIGN PATENT DOCUMENTS

| | | |
|---|---|---|
| JP | 2006-216940 A | 8/2006 |
| JP | 5443837 B2 | 3/2014 |
| JP | 5807432 B2 | 11/2015 |
| JP | WO 2016/151943 A1 | 9/2017 |
| JP | 2019-145776 A | 8/2019 |
| JP | 2020-150570 A | 9/2020 |
| JP | 2020-188164 A | 11/2020 |

* cited by examiner

US 12,272,627 B2

SEMICONDUCTOR DEVICE

CROSS-REFERENCE TO RELATED APPLICATION

This application is based upon and claims the benefit of priority from Japanese Patent Application No. 2021-154765, filed on Sep. 22, 2021, the entire contents of which are incorporated herein by reference.

FIELD

Embodiments described herein relate generally to a semiconductor device.

BACKGROUND

A semiconductor device such as a power converter including a DC-DC converter is required to be reduced in size and improved in power, that is, improved in power density. In order to improve the power density, packaging of semiconductor elements has been advanced.

DETAILED DESCRIPTION

Figure 1:
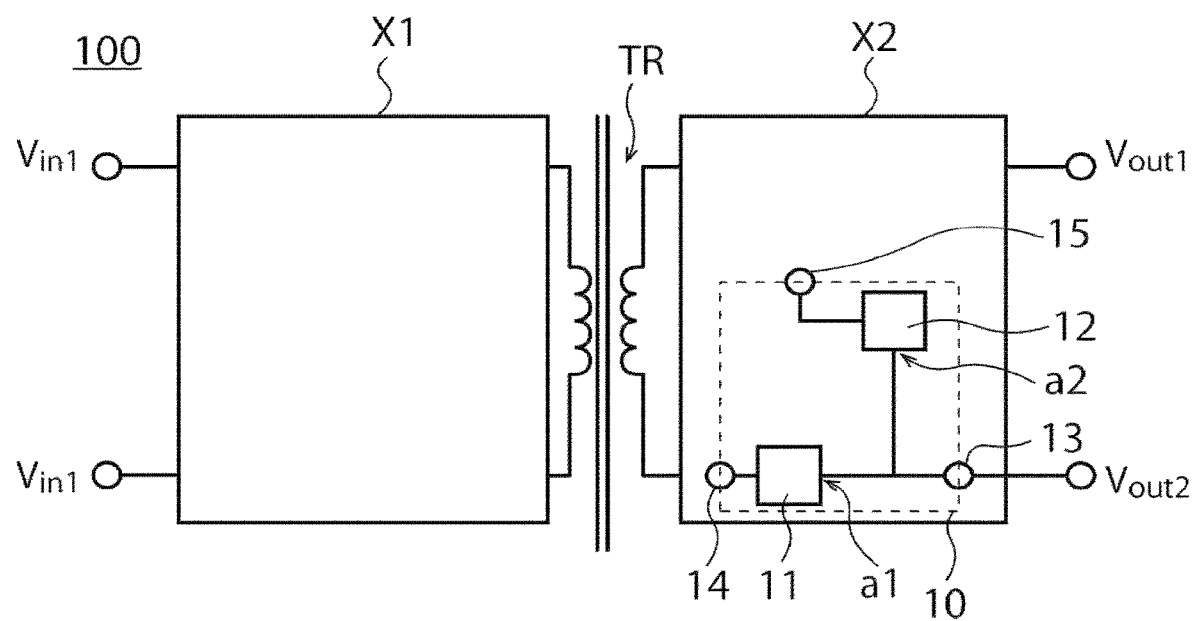
FIG. 1 is a schematic diagram of a semiconductor device according to an embodiment.

A semiconductor device comprising a DC-DC converter including a primary-side circuit and a secondary-side circuit including a first semiconductor package accommodating a first semiconductor element group including a first semiconductor element and a second semiconductor element. The first semiconductor element and the second semiconductor element are stacked. The first semiconductor element group is a MOSFET, an IGBT, or a diode. When the first semiconductor element group is the MOSFET, a source electrode of the first semiconductor element and a source electrode of the second semiconductor element are electrically connected to face each other in a stacking direction of the first semiconductor element and the second semiconductor element, and when the first semiconductor element group is the IGBT, an emitter electrode of the first semiconductor element and an emitter electrode of the second semiconductor element are electrically connected to face each other in the stacking direction of the first semiconductor element and the second semiconductor element, or when the first semiconductor element group is the diode, a first lead frame in which a cathode electrode of the first semiconductor element and a cathode electrode of the second semiconductor element are electrically connected to face each other in the stacking direction of the first semiconductor element and the second semiconductor element is included in the first semiconductor package. The first lead frame is positioned between the first semiconductor element and the second semiconductor element.

Hereinafter, embodiments of the present disclosure will be described with reference to the drawings. In the following description, the same or similar members are denoted by the same reference numerals, and descriptions of members once described may be omitted.

In the present specification, in order to indicate a positional relationship of components and the like, an upward direction in the drawings is described as "upper", and a downward direction in the drawings is described as "lower" or "bottom". In the present specification, the concepts of "upper", "lower", and "bottom" are not necessarily terms indicating the relationship with the direction of gravity.

First Embodiment

A first embodiment relates to a semiconductor device, specifically, a power converter. The power converter includes a DC-DC converter. FIG. 1 is a schematic circuit diagram of a power converter 100 according to an embodiment. The schematic circuit diagram of FIG. 1 includes a transformer TR, a primary-side circuit X1, and a secondary-side circuit X2. The primary-side circuit X1 and the secondary-side circuit X2 are insulated by a transformer TR.

The primary-side circuit X1 is connected to a primary coil of the transformer TR. The primary coil and an input power supply are connected in parallel with the primary-side circuit X1. The primary-side circuit X1 is connected to a high potential side input terminal $V_{in1}$ and a low potential side input terminal $V_{in2}$. The high potential side input terminal $V_{in1}$ and the low potential side input terminal $V_{in2}$ are connected to an input power supply (DC power supply). A DC power supply is input to the high potential side input terminal $V_{in1}$ and the low potential side input terminal $V_{in2}$ of the primary-side circuit X1, and is converted into an alternating current by a circuit including a switching element. An alternating current flows through the primary coil of the transformer TR, and an alternating current induced from the primary coil flows through the secondary coil of the secondary-side circuit X2.

The secondary-side circuit X2 is connected to the secondary coil of the transformer TR. The secondary-side circuit X2 is connected to a high potential side output terminal $V_{out1}$ and a low potential side output terminal $V_{out2}$. The high potential side output terminal $V_{out1}$ and the low potential side output terminal $V_{out2}$ are connected to, for example, a load (not illustrated). The secondary-side circuit X2 includes a first semiconductor package 10. The alternating current flowing from the secondary coil to the secondary-side circuit X2 is converted into a direct current in the secondary-side circuit X2.

The first semiconductor package 10 accommodates a first semiconductor element group including a first semiconductor element 11 and a second semiconductor element 12. The first semiconductor package 10 may include a semiconductor element other than the first semiconductor element 11 and the second semiconductor element 12. The first semiconductor package 10 includes a first common terminal 13. The first semiconductor package 10 includes a first non-common terminal 14 connected to the first semiconductor element 11 and a second non-common terminal 15 connected to the second semiconductor element 12. A current flows from the first non-common terminal 14 and the second non-common terminal 15 to the first common terminal 13. That is, the current inputs (terminals) of the two semiconductor elements 11 and 12 are different, and the current outputs (terminals) thereof are common. The first common terminal 13 is electrically connected to the low potential side output terminal $V_{out2}$ of the secondary-side circuit X2.

The first semiconductor element 11 and the second semiconductor element 12 are sealed with a sealing material m. In the embodiment, a portion of an end portion of a lead frame exposed from the sealing material m is a terminal, but a threaded terminal or the like used in a semiconductor package can be adopted, and the present disclosure is not particularly limited.

The first semiconductor element group is preferably a metal oxide semiconductor field effect transistor (MOSFET), an insulated gate bipolar transistor (IGBT), or a diode. The first semiconductor element 11 and the second semiconductor element 12 are preferably the same type of semiconductor element. That is, when the MOSFET is used as the first semiconductor element 11, the MOSFET is used as the second semiconductor element 12, but the IGBT or the diode is not used as the second semiconductor element 12.

Specifically, as the MOSFET, a vertical MOSFET is preferable, and an n-type MOSFET is preferable. In the embodiment, the n-type MOSFET will be described as an example.

Specifically, as the IGBT, a vertical IGBT is preferable, and an n-channel type IGBT is preferable. In the embodiment, the n-channel type IGBT will be described as an example.

Specifically, a vertical diode is preferable as the diode, and a vertical Schottky barrier diode is more preferable.

The sealing material m is, for example, a mold resin, and typically contains an epoxy resin and a filler.

Figure 2:
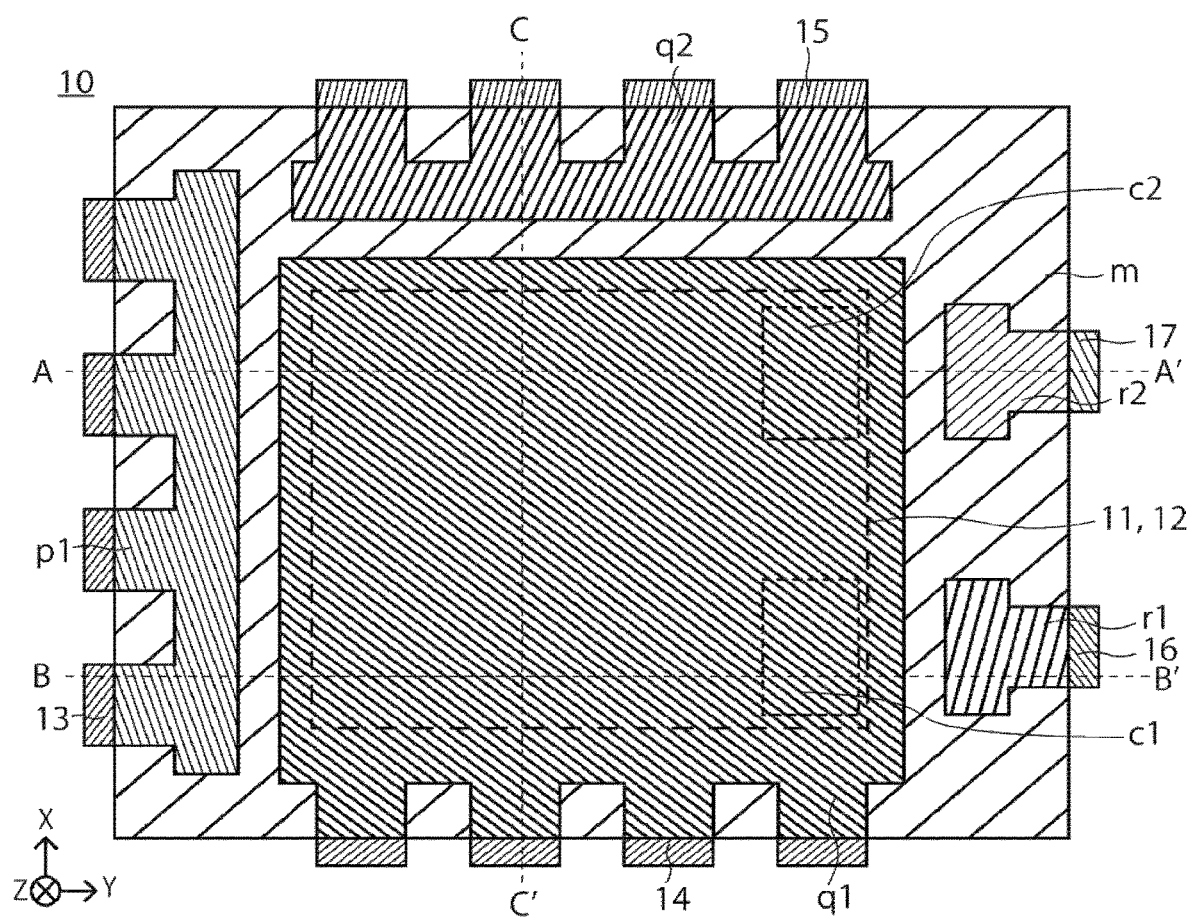
FIG. 2 is a schematic diagram of a semiconductor package according to an embodiment.
Figure 3:
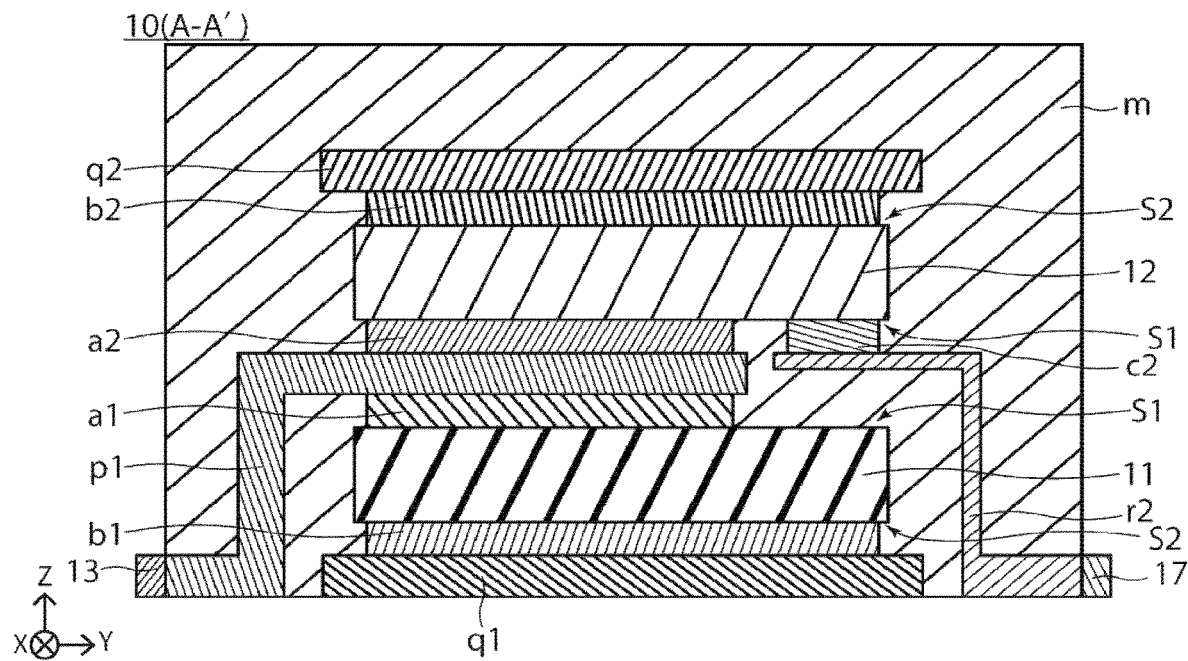
FIG. 3 is a schematic cross-sectional view of a semiconductor package according to an embodiment.
Figure 4:
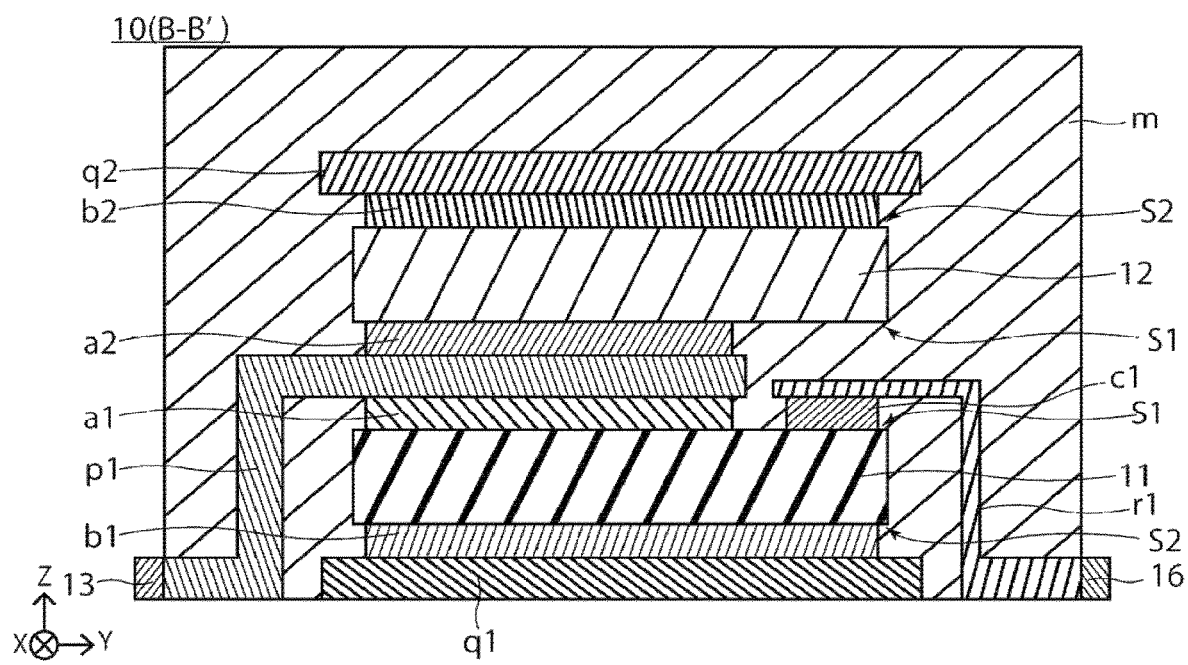
FIG. 4 is a schematic cross-sectional view of a semiconductor package according to an embodiment.

FIGS. 2 to 4 are schematic cross-sectional views of the first semiconductor package 10. A stacking direction of the first semiconductor element 11 and the second semiconductor element 12 is defined as a Z direction, and a direction perpendicular to the Z direction is defined as an X direction and a Y direction. The X direction and the Y direction are orthogonal to each other. A surface of the first semiconductor element 11 facing the second semiconductor element 12 is preferably parallel to an X-Y plane. In addition, a surface of the second semiconductor element 12 facing the first semiconductor element 11 is preferably parallel to the X-Y plane.

Figure 5:
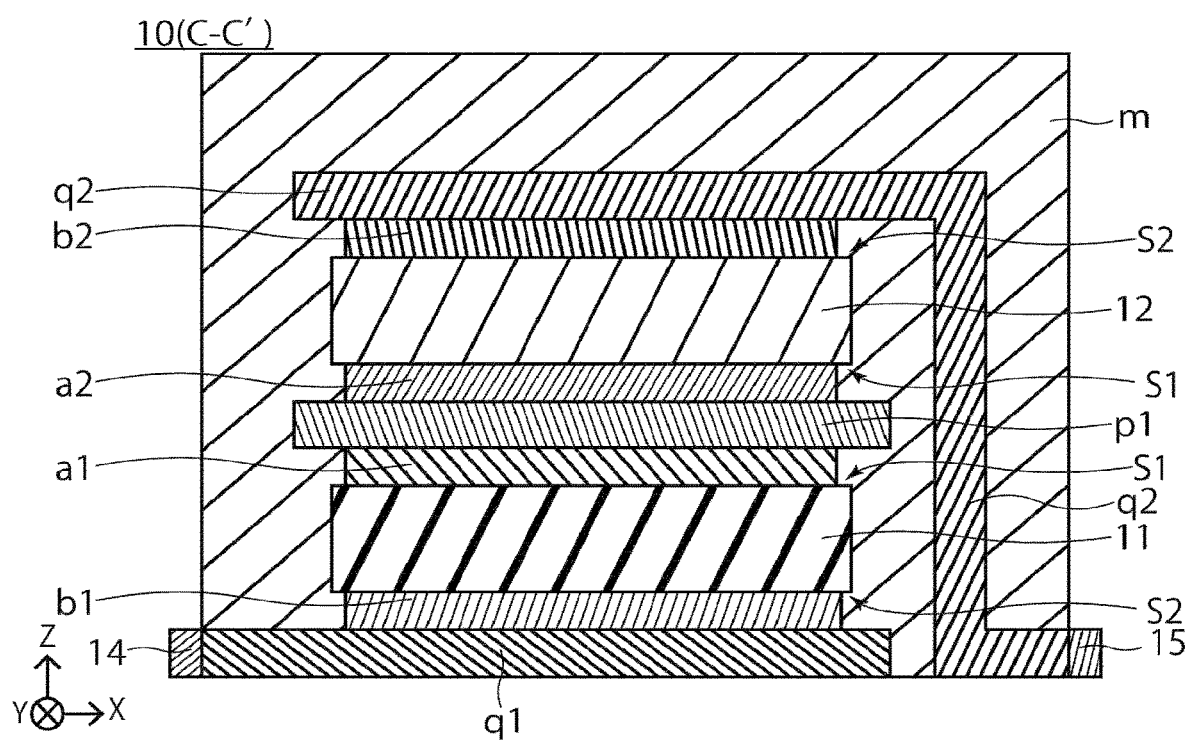
FIG. 5 is a schematic cross-sectional view of a semiconductor package according to an embodiment.

A schematic diagram (X-Y plane) of FIG. 2 is a schematic diagram viewed from a bottom surface side which is a terminal side of the first semiconductor package 10. In addition, the cross-sectional view of FIG. 2 also illustrates members and the like that are not visible from a portion of a bottom surface. FIG. 3 is a schematic cross-sectional view taken along line A-A' (Y-Z plane) in FIG. 2. FIG. 4 is a schematic cross-sectional view taken along line B-B' (Y-Z plane) in FIG. 2. FIG. 5 is a schematic cross-sectional view taken along line C-C' (X-Z plane) in FIG. 2.

The first semiconductor element 11 and the second semiconductor element 12 in first semiconductor package 10 are stacked so as to be electrically connected in parallel with each other.

The first semiconductor package 10 illustrated in the schematic diagrams of FIGS. 2 to 5 will be described with an example in which the first semiconductor element group, that is, the first semiconductor element 11 and the second semiconductor element 12 are n-type MOSFETs. A portion of the following description is common to a case where the first semiconductor element 11 and the second semiconductor element 12 are IGBTs or diodes. The first semiconductor element 11 and the second semiconductor element 12 are both n-type (n-channel type) MOSFETs or IGBTs.

The first semiconductor element 11 includes a source electrode a1, a drain electrode b1, and a gate electrode c1. Moreover, the second semiconductor element 12 includes a source electrode a2, a drain electrode b2, and a gate electrode c2.

The source electrode a1 of the first semiconductor element 11 is electrically connected to a source of the first semiconductor element 11, and is provided on a surface (first surface S1) of the first semiconductor element 11. The source electrode a2 of the second semiconductor element 12 is electrically connected to a source of the second semiconductor element 12, and is provided on a surface (first surface S1) of the second semiconductor element 12.

The drain electrode b1 of the first semiconductor element 11 is electrically connected to a drain of the first semiconductor element 11, and is provided on a surface (second surface S2) of the first semiconductor element 11. The second surface S2 of the first semiconductor element 11 is a surface opposite to the first surface S1 of the first semiconductor element 11. The drain electrode b2 of the second semiconductor element 12 is electrically connected to a drain of the second semiconductor element 12, and is provided on a surface (second surface S2) of the second semiconductor element 12. The second surface S2 of the second semiconductor element 12 is a surface opposite to the first surface S1 of the second semiconductor element 12.

Gate electrode c1 of first semiconductor element 11 is electrically connected to the gate of first semiconductor element 11, and provided on the surface (first surface S1) of first semiconductor element 11. The gate electrode c2 of the second semiconductor element 12 is electrically connected to a gate of the second semiconductor element 12, and is provided on a surface (first surface S1) of the second semiconductor element 12.

Each electrode of the first semiconductor element 11 and the second semiconductor element 12 includes an electrode pad or a conductive bonding member such as an electrode pad and solder.

The source electrode a1 of the first semiconductor element 11 and the source electrode a2 of the second semiconductor element 12 face each other in the stacking direction of the first semiconductor element 11 and the second semiconductor element 12 and electrically connected to each other.

The first surface S1 of the first semiconductor element 11 and the first surface S1 of the second semiconductor element 12 face each other, that is, the source electrode a1 of the first semiconductor element 11 and the source electrode a2 of the second semiconductor element 12 face each other while facing the inside of the first semiconductor package 10.

The drain electrode b1 of the first semiconductor element 11 and the drain electrode b2 of the second semiconductor element 12 face in opposite directions toward the outside of the first semiconductor package 10.

When the first semiconductor element group is the MOSFET, the first semiconductor element group includes a lead frame p1 (first lead frame) in which the source electrode a1 of the first semiconductor element 11 and the source electrode a2 of the second semiconductor element 12 are electrically connected to face each other. The source electrode a1 of the first semiconductor element 11 and the source electrode a2 of the second semiconductor element 12 preferably face each other in the stacking direction of the first semiconductor element 11 and the second semiconductor element 12. A surface of the lead frame p1 of the first semiconductor package 10 facing the first semiconductor element 11 is directly connected to the source electrode a1 of the first semiconductor element 11. A surface of the lead frame p1 of the first semiconductor package 10 facing the second semiconductor element 12 is directly connected to the source electrode a2 of the second semiconductor element 12.

As illustrated in the cross-sectional views of FIGS. 3 and 4, the lead frame p1 is provided between the source electrode a1 and the source electrode a2. The lead frame p1 is connected to both the source of the first semiconductor element 11 and the source of the second semiconductor element 12. The lead frame p1 is preferably in contact with the source electrode a1 and the source electrode a2 and in direct contact therewith. As illustrated in FIGS. 3 and 4, the lead frame p1 extends toward the first common terminal 13. A portion of the lead frame p1 extends to a bottom surface side of the first semiconductor package 10. As illustrated in FIG. 2, the lead frame p1 is connected to the first common terminal 13 exposed outside a side surface of the semiconductor package 10.

As illustrated in FIGS. 2 to 4, the drain electrode b1 of the first semiconductor element 11 is located on the bottom surface side of the first semiconductor package 10. The drain electrode b1 is preferably in contact with a lead frame q1 and directly in contact therewith. The lead frame q1 is connected to the drain of the first semiconductor element 11, but is not connected to the drain of the second semiconductor element 12. As illustrated in FIGS. 2 to 4, the lead frame q1 is preferably exposed to the bottom surface side of the first semiconductor package 10. As illustrated in FIGS. 2 to 4, the lead frame q1 is connected to the first non-common terminal 14 exposed outside the side surface of the semiconductor package 10.

As illustrated in FIGS. 2 to 5, the drain electrode b2 of the second semiconductor element 12 is located on the upper surface side of the first semiconductor package 10. That is, the source electrode a1 and the source electrode a2 are positioned between the drain electrode b1 and the drain electrode b2. The drain electrode b2 is preferably in contact with the lead frame q2 and directly in contact therewith. The lead frame q2 is connected to the drain of the second semiconductor element 12, but is not connected to the lead frame q1 of the first semiconductor element 11. As illustrated in FIG. 5, the lead frame q2 is bent and extends toward the bottom surface direction of the first semiconductor package 10. The lead frame q1 is independent of the lead frame q2. The lead frame q2 is connected to the second non-common terminal 15 exposed outside the side surface of the first semiconductor package 10. The first non-common terminal 14 is independent of the second non-common terminal 15.

As illustrated in FIGS. 2 to 5, the lead frame q1 extends in a direction opposite to the lead frame q2. As illustrated in FIGS. 2 to 5, the lead frame p1 extends in a direction shifted by 90° with respect to the lead frame q1.

As illustrated in FIGS. 2 to 4, the gate electrode c1 of the first semiconductor element 11 is adjacent to the source electrode a1 on the first surface S1 of the first semiconductor element 11. The gate electrode c1 is preferably in contact with a lead frame r1 and directly in contact therewith. The lead frame r1 is connected to the gate of the first semiconductor element 11, but is not connected to the gate of the second semiconductor element 12. As illustrated in FIG. 3, the lead frame r1 extends while being bent toward the bottom surface side of the first semiconductor package 10. The lead frame r1 is connected to a gate terminal 16 exposed outside the side surface of the first semiconductor package 10. A gate driver (not illustrated) is connected to the gate terminal 16. The operation of first semiconductor element 11 is controlled by the gate driver.

As illustrated in FIGS. 2 to 4, the gate electrode c2 of the second semiconductor element 12 is adjacent to the source electrode a2 on the first surface S1 of the second semiconductor element 12. The gate electrode c2 is preferably in contact with the lead frame r2 and directly in contact therewith. The lead frame r2 is connected to the gate of the second semiconductor element 12, but is not connected to the gate of the first semiconductor element 11. As illustrated in FIG. 4, the lead frame r2 extends while being bent toward the bottom surface side of the first semiconductor package 10. The lead frame r2 is connected to the gate terminal 17 exposed outside the side surface of the first semiconductor package 10. A gate driver (not illustrated) is connected to the gate terminal 17. The operation of the second semiconductor element 12 is controlled by the gate driver.

As illustrated in FIGS. 2 to 4, the lead frame r1 extends in parallel with the lead frame r2. As illustrated in FIGS. 2 to 4, the lead frame r1 and the lead frame r2 extend in a direction shifted from the lead frame q1 by 90° to the side opposite to the lead frame p1.

When the gate electrode c1 and the gate electrode c2 are disposed so as to overlap each other in the stacking direction of the first semiconductor element 11 and the second semiconductor element 12, the lead frame r1 and the lead frame r2 are easily short-circuited. Therefore, as illustrated in the schematic diagrams of FIGS. 2 to 4, it is preferable that the gate electrode c1 and the gate electrode c2 do not overlap in the stacking direction of the first semiconductor element 11 and the second semiconductor element 12.

In the first semiconductor package 10, the source electrode a1 and the source electrode a2 are provided so as to sandwich the lead frame p1. Then, it is possible to achieve both of stacking the first semiconductor element 11 and the second semiconductor element 12 and connecting the sources of both semiconductor elements with one lead frame p1. The first semiconductor package 10 can be provided in a smaller area than a case where the two switching (diodes) provided in the secondary-side circuit X2 of the DC-DC converter are separately provided, and thus, the mounting area is reduced, which contributes to miniaturization of the power converter 100. That is, the power converter 100 using the first semiconductor package 10 can increase the power density. In a case where the first semiconductor element 11 and the second semiconductor element 12 are separately provided, a heat dissipation member such as a heat sink is used for each semiconductor element. However, by using the first semiconductor package 10 as in the embodiment, the heat dissipation member can also be made one, and the power converter 100 of the embodiment contributes to reducing the member cost and the mounting cost. In the first semiconductor package 10, the semiconductor package 10 can be freely designed except that the lead frame p1 is connected to both sources between two semiconductor elements.

In a case where the first semiconductor element 11 and the second semiconductor element 12 are complementarily turned on and off, when the area of the first semiconductor element 11 and the area of the second semiconductor element 12 are substantially the same, the currents flowing through the two elements are about the same, the temperature rises of the two elements are substantially the same, and the elements are less likely to be broken. That is, an element region area of the first semiconductor element 11 and an element region area of the second semiconductor element 12 are preferably substantially the same. Specifically, the area of the first semiconductor element 11 (the area of the element region) is preferably 50% or more and 150% or less, more preferably 75% or more and 125% or less, still more preferably 90% or more and 110% or less of the area of the second semiconductor element 12 (the area of the element region).

Next, the first semiconductor package 10 illustrated in the schematic diagrams of FIGS. 6 to 10 will be described with an example in which the first semiconductor element group, that is, the first semiconductor element 11 and the second semiconductor element 12 are n-channel type IGBTs.

Figure 6:
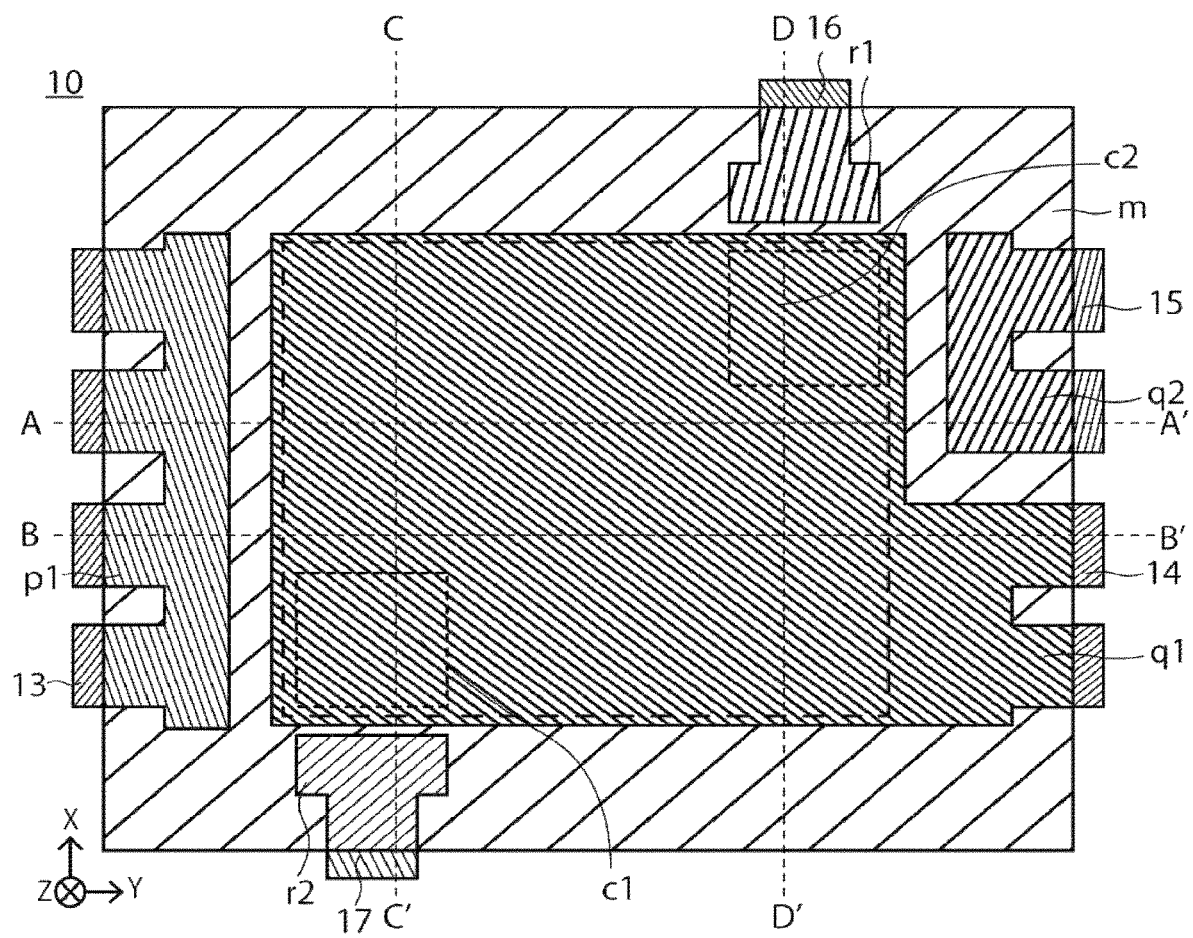
FIG. 6 is a schematic diagram of a semiconductor package according to an embodiment.
Figure 7:
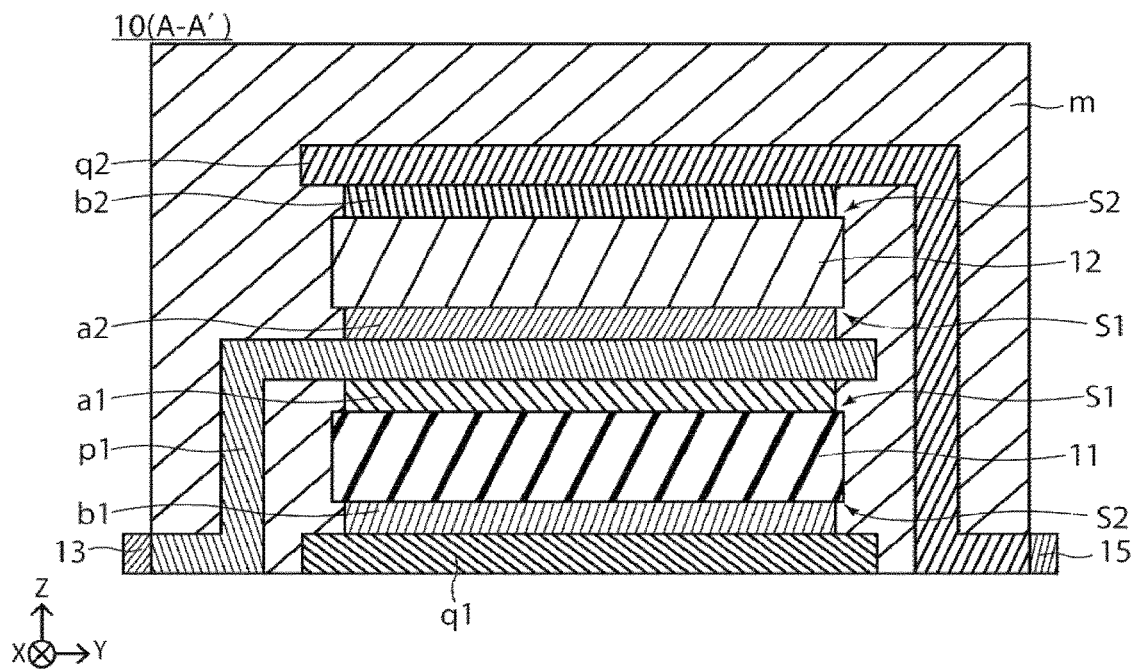
FIG. 7 is a schematic cross-sectional view of a semiconductor package according to an embodiment.
Figure 8:
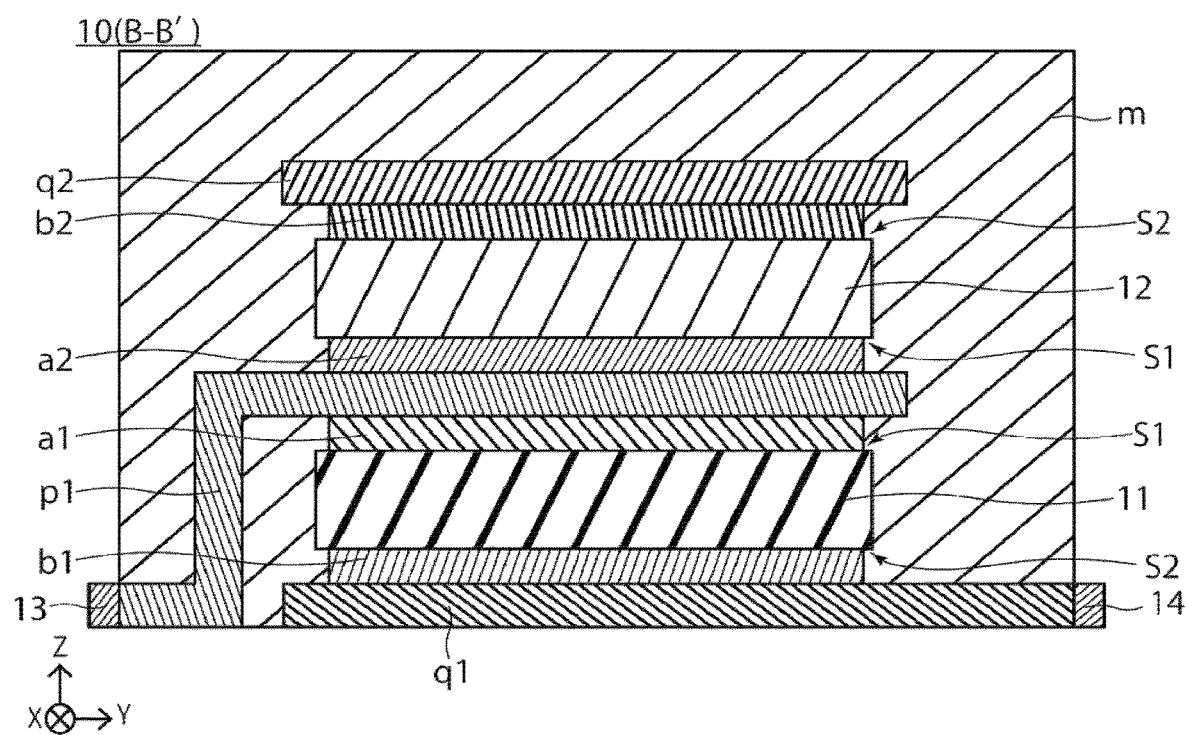
FIG. 8 is a schematic cross-sectional view of a semiconductor package according to an embodiment.
Figure 9:
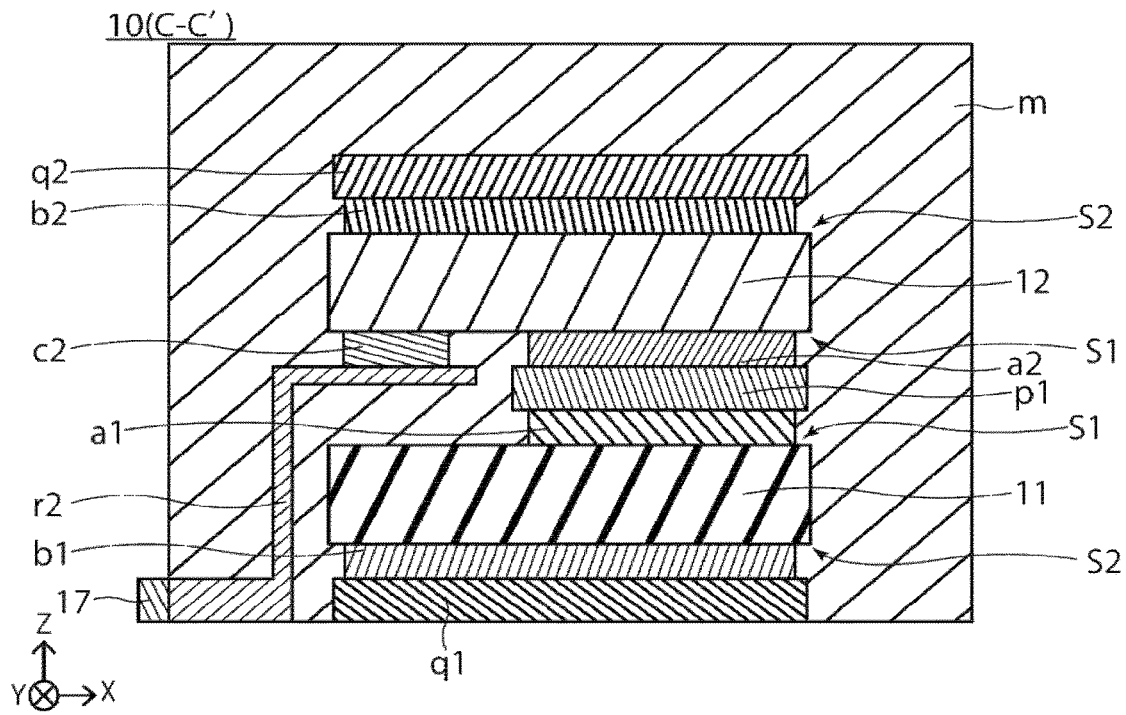
FIG. 9 is a schematic cross-sectional view of a semiconductor package according to an embodiment.
Figure 10:
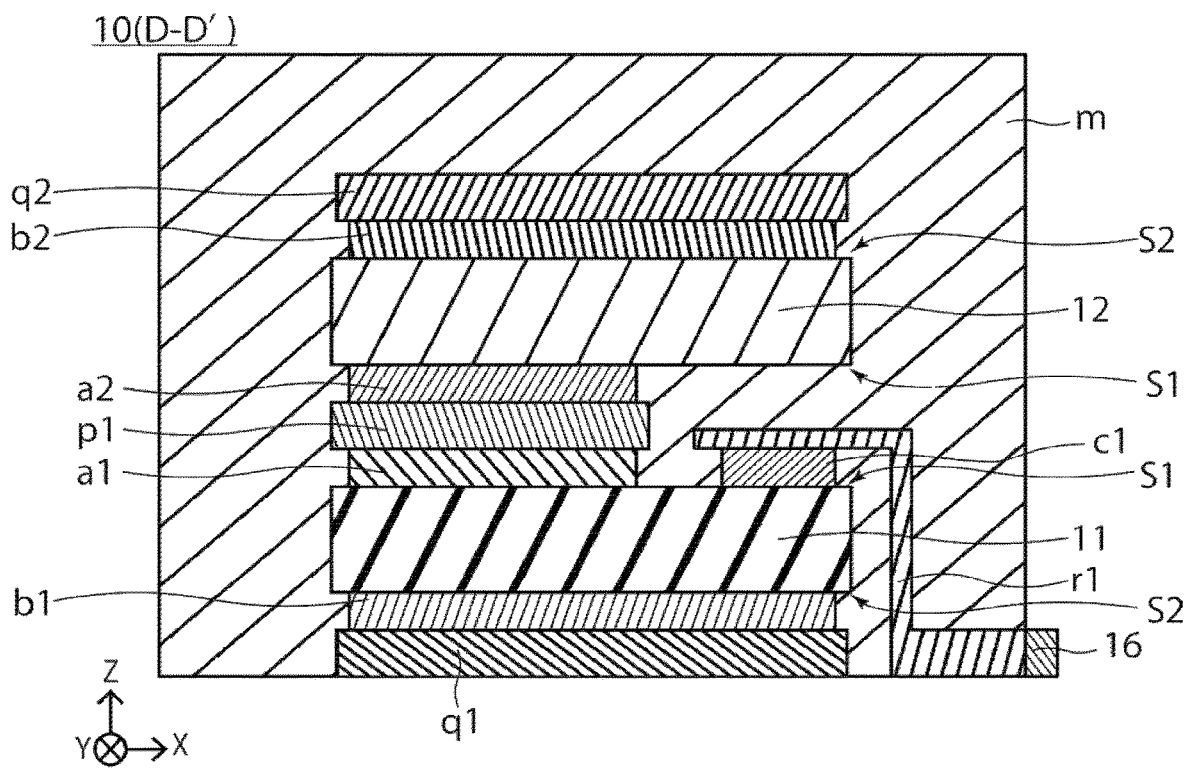
FIG. 10 is a schematic cross-sectional view of a semiconductor package according to an embodiment.
Figure 11:
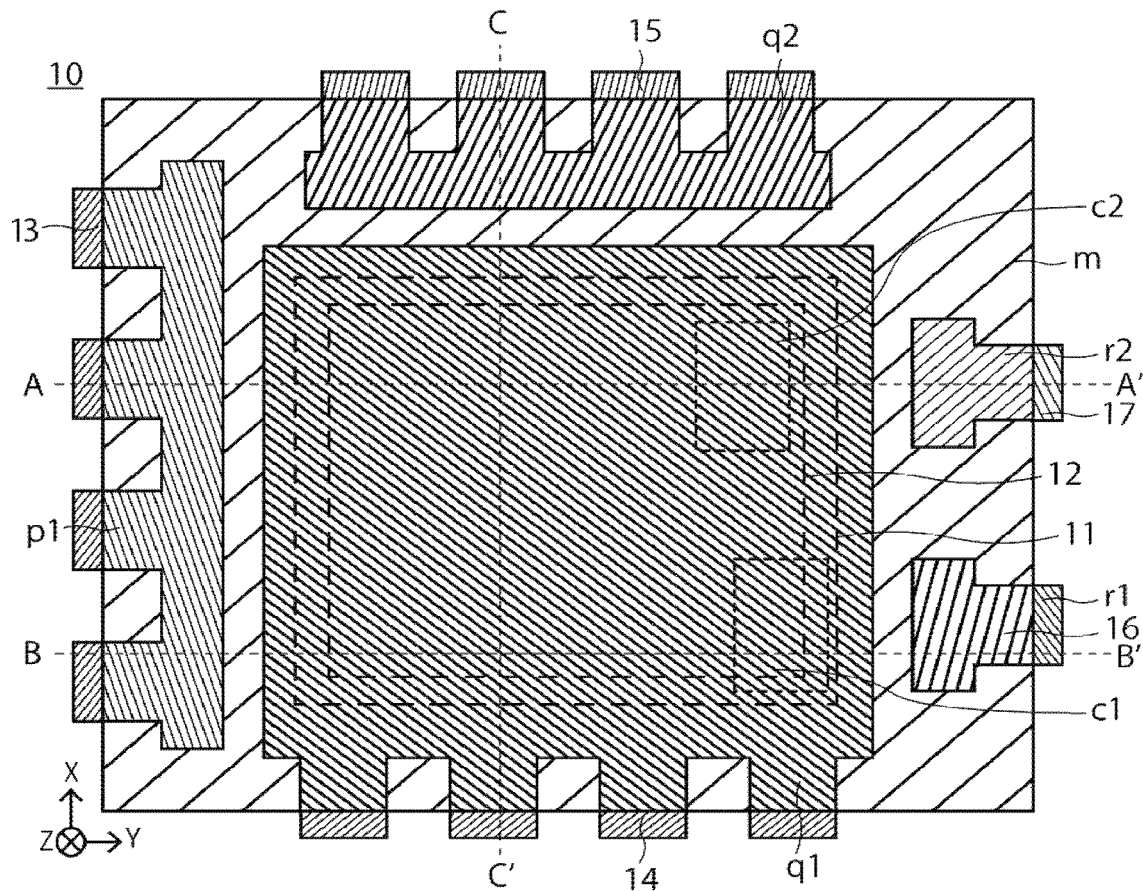
FIG. 11 is a schematic diagram of a semiconductor package according to an embodiment.

A schematic diagram (X-Y plane) of FIG. 6 is a schematic diagram viewed from a bottom surface side which is a terminal side of the first semiconductor package 10. Furthermore, the cross-sectional view of FIG. 6 also illustrates a member or the like that is not visible from a portion of the bottom surface. FIG. 7 is a schematic cross-sectional view taken along line A-A' (Y-Z plane) in FIG. 6. FIG. 8 is a schematic cross-sectional view taken along line B-B' (Y-Z plane) in FIG. 6. FIG. 9 is a schematic cross-sectional view taken along line C-C' (X-Z plane) in FIG. 6. FIG. 10 is a schematic cross-sectional view taken along line D-D' (Y-Z plane) in FIG. 6.

The first semiconductor element 11 includes an emitter electrode a1, a collector electrode b1, and a base electrode c1. The second semiconductor element 12 includes an emitter electrode a2, a collector electrode b2, and a base electrode c2.

The emitter electrode a1 of the first semiconductor element 11 is electrically connected to the emitter of first semiconductor element 11, and provided on the surface (first surface S1) of first semiconductor element 11. The emitter electrode a2 of the second semiconductor element 12 is electrically connected to the emitter of the second semiconductor element 12, and is provided on the surface (first surface S1) of the second semiconductor element 12.

The collector electrode b1 of the first semiconductor element 11 is electrically connected to the collector of the first semiconductor element 11, and is provided on the surface (second surface S2) of the first semiconductor element 11. The first surface S1 of the first semiconductor element 11 is a surface opposite to first surface S1 of first semiconductor element 11. The collector electrode b2 of the second semiconductor element 12 is electrically connected to the collector of the second semiconductor element 12, and is provided on the surface (second surface S2) of the second semiconductor element 12. The first surface S1 of the second semiconductor element 12 is a surface opposite to the first surface S1 of the second semiconductor element 12.

The base electrode c1 of the first semiconductor element 11 is electrically connected to the base of the first semiconductor element 11, and is provided on the surface (first surface S1) of the first semiconductor element 11. The base electrode c2 of the second semiconductor element 12 is electrically connected to the base of the second semiconductor element 12, and is provided on the surface (first surface S1) of the second semiconductor element 12.

The emitter electrode a1 of the first semiconductor element 11 and the emitter electrode a2 of the second semiconductor element 12 are electrically connected to face each other in the stacking direction of the first semiconductor element 11 and the second semiconductor element 12.

When the first semiconductor element group is an IGBT, the first semiconductor element group includes the lead frame p1 (first lead frame) in which the emitter electrode a1 of the first semiconductor element 11 and the emitter electrode a2 of the second semiconductor element 12 are electrically connected to face each other. The emitter electrode a1 of the first semiconductor element 11 and the emitter electrode a2 of the second semiconductor element 12 preferably face each other in the stacking direction of the first semiconductor element 11 and the second semiconductor element 12. The surface of the lead frame p1 of the first semiconductor package 10 facing the first semiconductor element 11 is directly connected to the emitter electrode a1 of the first semiconductor element 11. A surface of the lead frame p1 of the first semiconductor package 10 facing the second semiconductor element 12 is directly connected to the emitter electrode a2 of the second semiconductor element 12.

The first surface S1 of the first semiconductor element 11 and the first surface S1 of the second semiconductor element 12 face each other, that is, the emitter electrode a1 of the first semiconductor element 11 and the emitter electrode a2 of the second semiconductor element 12 face each other while facing the inside of the first semiconductor package 10.

The collector electrode b1 of the first semiconductor element 11 and the collector electrode b2 of the second semiconductor element 12 face in opposite directions toward the outside of the first semiconductor package 10.

As illustrated in the cross-sectional views of FIGS. 7 and 8, the lead frame p1 is provided between the emitter electrode a1 and the emitter electrode a2. The lead frame p1 is connected to both the emitter of the first semiconductor element 11 and the emitter of the second semiconductor element 12. The lead frame p1 is preferably in contact with the emitter electrode a1 and the emitter electrode a2 and in direct contact therewith. As illustrated in FIGS. 7 and 8, the lead frame p1 extends toward the first common terminal 13. A portion of the lead frame p1 extends to a bottom surface side of the first semiconductor package 10. As illustrated in FIG. 2, the lead frame p1 is connected to the first common terminal 13 exposed outside a side surface of the semiconductor package 10.

As illustrated in FIGS. 6 to 8, the collector electrode b1 of the first semiconductor element 11 is located on the bottom surface side of the first semiconductor package 10. The collector electrode b1 is preferably in contact with the lead frame q1 and directly in contact therewith. The lead frame q1 is connected to the collector of the first semiconductor element 11, but is not connected to the collector of the second semiconductor element 12. As illustrated in FIGS. 6 to 8, the lead frame q1 is preferably exposed to the bottom surface side of the first semiconductor package 10. As illustrated in FIGS. 2 to 4, the lead frame q2 is connected to the first non-common terminal 14 exposed outside the side surface of the semiconductor package 10.

As illustrated in FIGS. 6 to 8, the collector electrode b2 of the second semiconductor element 12 is located on the upper surface side of the first semiconductor package 10. That is, the emitter electrode a1 and the emitter electrode a2 are positioned between the collector electrode b1 and the collector electrode b2. The collector electrode b2 is preferably in contact with the lead frame q2 and directly in contact therewith. The lead frame q2 is connected to the collector of the second semiconductor element 12, but is not connected to the lead frame q1 of the first semiconductor element 11. As illustrated in FIG. 5, the lead frame q2 extends while being bent toward the bottom surface side of the first semiconductor package 10. The lead frame q1 is independent of the lead frame q2. The lead frame q2 is connected to the second non-common terminal 15 exposed to the outside of the side surface of the first semiconductor package 10. The first non-common terminal 14 is independent of the second non-common terminal 15.

As illustrated in FIGS. 6 to 8, the lead frame q1 extends in parallel with the lead frame q2. As illustrated in FIGS. 6 to 8, the lead frame p1 extends on the side opposite to the lead frame q1 and the lead frame q2.

As illustrated in FIGS. 6 and 9, the base electrode c1 of the first semiconductor element 11 is adjacent to the emitter electrode a1 on the first surface S1 of the first semiconductor element 11. The base electrode c1 is preferably in contact with the lead frame r1 and directly in contact therewith. The lead frame r1 is connected to the base of the first semiconductor element 11, but is not connected to the base of the second semiconductor element 12. As illustrated in FIG. 9, the lead frame r1 extends while being bent toward the bottom surface side of the first semiconductor package 10. The lead frame r1 is connected to the base terminal 16 exposed outside the side surface of the first semiconductor package 10. The base terminal 16 is connected to an IGBT driver (not illustrated). The operation of the first semiconductor element 11 is controlled by an IGBT driver.

As illustrated in FIGS. 6 and 10, the base electrode c2 of the second semiconductor element 12 is adjacent to the emitter electrode a2 on the first surface S1 of the second semiconductor element 12. The base electrode c2 is preferably in contact with the lead frame r2 and directly in contact therewith. The lead frame r2 is connected to the base of the second semiconductor element 12, but is not connected to the base of the first semiconductor element 11. As illustrated in FIG. 10, the lead frame r2 extends while being bent toward the bottom surface side of the first semiconductor package 10. The lead frame r2 is connected to the base terminal 17 exposed outside the side surface of the first semiconductor package 10. The base terminal 17 is connected to an IGBT driver (not illustrated). The operation of the second semiconductor element 12 is controlled by an IGBT driver.

As illustrated in FIGS. 6, 9 and 10, the lead frame r1 extends in a direction opposite to the lead frame r2. As illustrated in FIGS. 6, 9, and 10, the lead frame r1 extends in a direction shifted by 90° with respect to the lead frame q1. In addition, the lead frame r2 extends in a direction shifted by 90° to the side opposite to the lead frame r1 with respect to the lead frame q1.

Next, a first semiconductor package 10 in which the first semiconductor element 11 and the second semiconductor element 12 are different in size will be described with reference to schematic diagrams of FIGS. 11 to 14. The MOSFET will be described as an example of the first semiconductor element 11 and the second semiconductor element 12, but the IGBT can be used instead of the MOSFET.

The first semiconductor package 10 illustrated in the schematic diagrams of FIGS. 11 to 14 is a modification of the semiconductor package 10 illustrated in the schematic diagrams of FIGS. 2 to 5. The first semiconductor package 10 illustrated in the schematic diagrams of FIGS. 11 to 14 is similar to the semiconductor package 10 illustrated in the schematic diagrams of FIGS. 2 to 5 except that the first semiconductor element 11 and the second semiconductor element 12 are different in size.

As illustrated in the schematic diagrams of FIGS. 11 to 14, the first semiconductor element 11 and the second semiconductor element 12 are different in size, but the first semiconductor element 11 and the second semiconductor element 12 are stacked so as to sandwich the lead frame p1 between the source electrode a1 and the source electrode a2.

Figure 12:
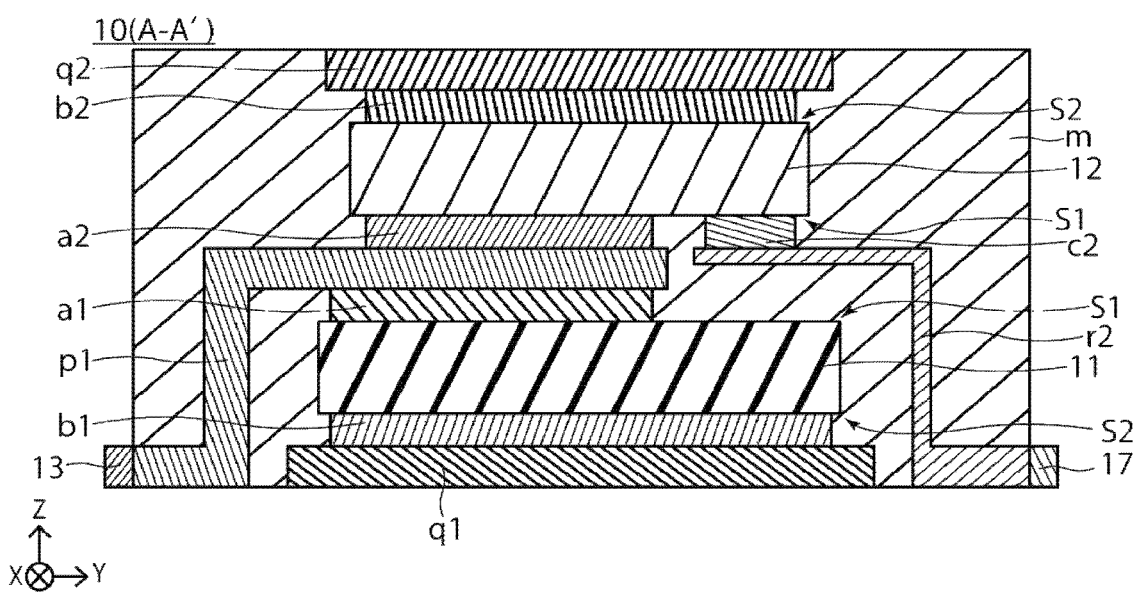
FIG. 12 is a schematic cross-sectional view of a semiconductor package according to an embodiment.
Figure 13:
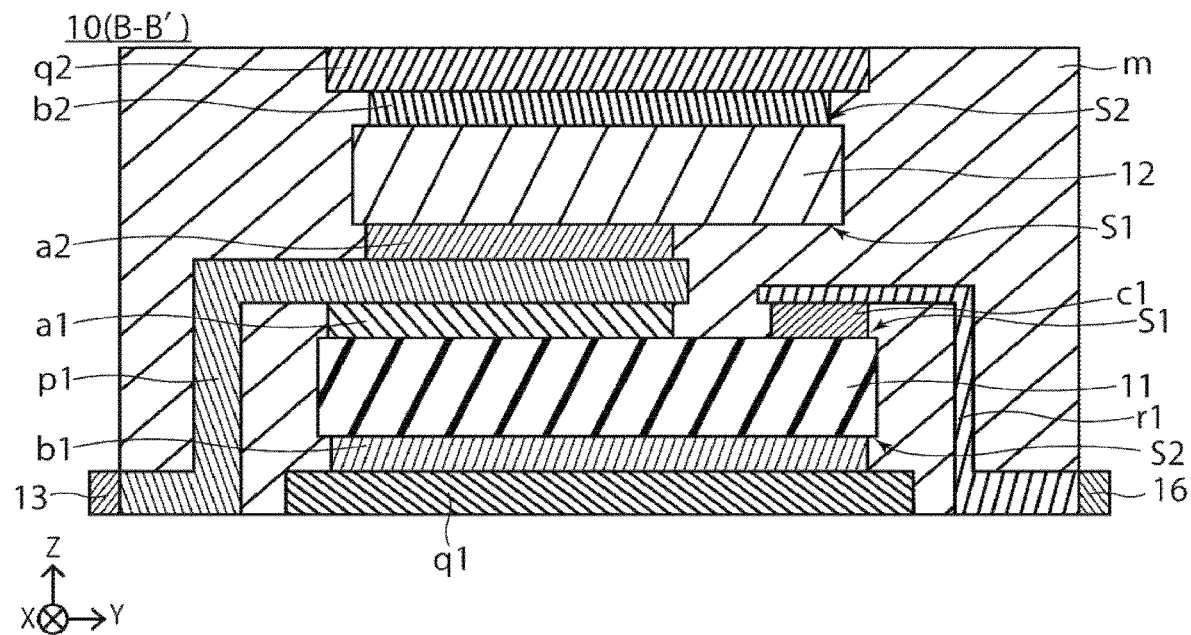
FIG. 13 is a schematic cross-sectional view of a semiconductor package according to an embodiment.

When the sizes of the first semiconductor element 11 and the second semiconductor element 12 are different from each other, as illustrated in the schematic diagrams of FIGS. 12 and 13, a configuration can be adopted in which the lead frame p1 located between the first semiconductor element 11 and the second semiconductor element 12 is in contact with the source electrode a1 and the source electrode a2, and the sources of the two semiconductor elements are connected to the first common terminal 13.

Figure 14:
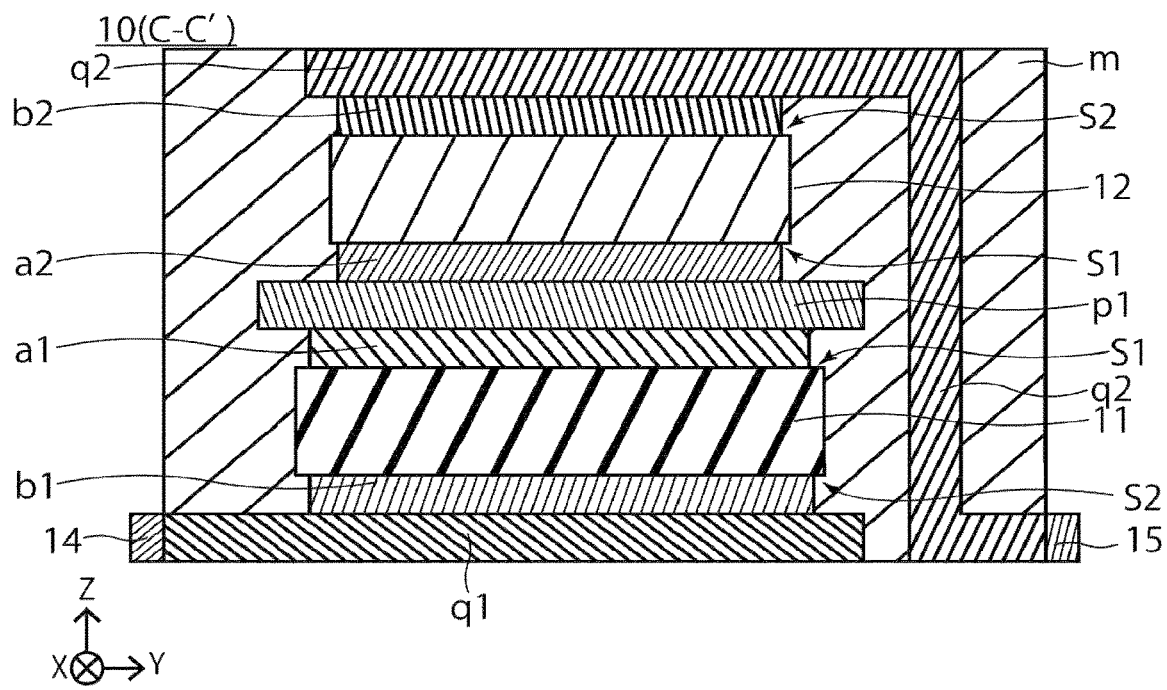
FIG. 14 is a schematic cross-sectional view of a semiconductor package according to an embodiment.

Even when the sizes of the first semiconductor element 11 and the second semiconductor element 12 are different, as illustrated in the cross-sectional views of FIGS. 12 to 14, the drain electrode b1 and the lead frame q1 can be connected, and the drain electrode b2 and the lead frame q2 can be connected. The lead frame q1 and the lead frame q2 are connected to the independent first non-common terminal 14 and second non-common terminal 15, respectively.

Even when the sizes of the first semiconductor element 11 and the second semiconductor element 12 are different, as illustrated in the cross-sectional views of FIGS. 12 and 13, the gate electrode c1 and the lead frame r1 can be connected, and the gate electrode c2 and the lead frame r2 can be connected. The lead frame r1 and the lead frame r2 are independent of each other.

Next, the first semiconductor package 10 illustrated in the schematic diagrams of FIGS. 15 to 17 will be described with an example in which the first semiconductor element group, that is, the first semiconductor element 11 and the second semiconductor element 12 are diodes.

Figure 15:
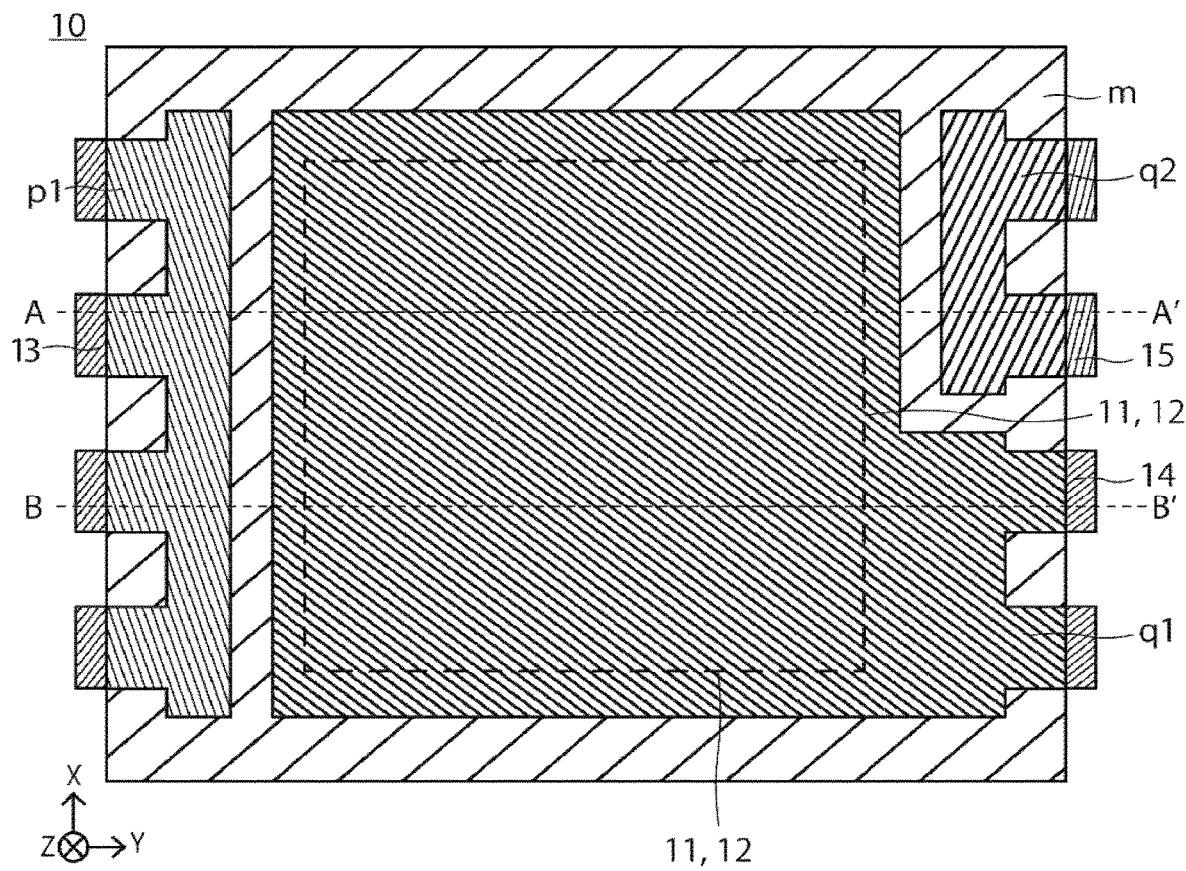
FIG. 15 is a schematic diagram of a semiconductor package according to an embodiment.

The schematic diagram (X-Y plane) of FIG. 15 is a schematic diagram viewed from a bottom surface side which is a terminal side of the first semiconductor package 10. Furthermore, the cross-sectional view of FIG. 15 also illustrates a member or the like that is not visible from a portion of the bottom surface. FIG. 16 is a schematic cross-sectional view taken along line A-A' (Y-Z plane) in FIG. 15. FIG. 17 is a schematic cross-sectional view taken along line B-B' (Y-Z plane) in FIG. 15.

The first semiconductor element 11 has a cathode electrode a1 and an anode electrode b1. The second semiconductor element 12 has a cathode electrode a2 and an anode electrode b2.

The cathode electrode a1 of the first semiconductor element 11 is electrically connected to a cathode of the first semiconductor element 11, and is provided on a surface (first surface S1) of the first semiconductor element 11. The cathode electrode a2 of the second semiconductor element 12 is electrically connected to a cathode of the second semiconductor element 12, and is provided on a surface (first surface S1) of the second semiconductor element 12.

The anode electrode b1 of the first semiconductor element 11 is electrically connected to an anode of the first semiconductor element 11, and is provided on a surface (second surface S2) of the first semiconductor element 11. The first surface S1 of the first semiconductor element 11 is a surface opposite to first surface S1 of first semiconductor element 11. The anode electrode b2 of the second semiconductor element 12 is electrically connected to the anode of the second semiconductor element 12, and is provided on the surface (second surface S2) of the second semiconductor element 12. The first surface S1 of the second semiconductor element 12 is a surface opposite to the first surface S1 of the second semiconductor element 12.

The cathode electrode a1 of the first semiconductor element 11 and the cathode electrode a2 of the second semiconductor element 12 face each other and are electrically connected to each other in the stacking direction of the first semiconductor element 11 and the second semiconductor element 12.

When the first semiconductor element group is a diode, the first semiconductor element group includes the lead frame p1 (first lead frame) in which the cathode electrode a1 of the first semiconductor element 11 and the cathode electrode a2 of the second semiconductor element 12 are electrically connected to face each other. The cathode electrode a1 of the first semiconductor element 11 and the cathode electrode a2 of the second semiconductor element 12 preferably face each other in the stacking direction of the first semiconductor element 11 and the second semiconductor element 12. A surface of the lead frame p1 of the first semiconductor package 10 facing the first semiconductor element 11 is directly connected to the cathode electrode a1 of the first semiconductor element 11. A surface of the lead frame p1 of the first semiconductor package 10 facing the second semiconductor element 12 is directly connected to the cathode electrode a2 of the second semiconductor element 12.

The first surface S1 of the first semiconductor element 11 and the first surface S1 of the second semiconductor element 12 face each other, that is, the cathode electrode a1 of the first semiconductor element 11 and the cathode electrode a2 of the second semiconductor element 12 face each other while facing the inside of the first semiconductor package 10.

The anode electrode b1 of the first semiconductor element 11 and the anode electrode b2 of the second semiconductor element 12 face in opposite directions toward the outside of the first semiconductor package 10.

Figure 16:
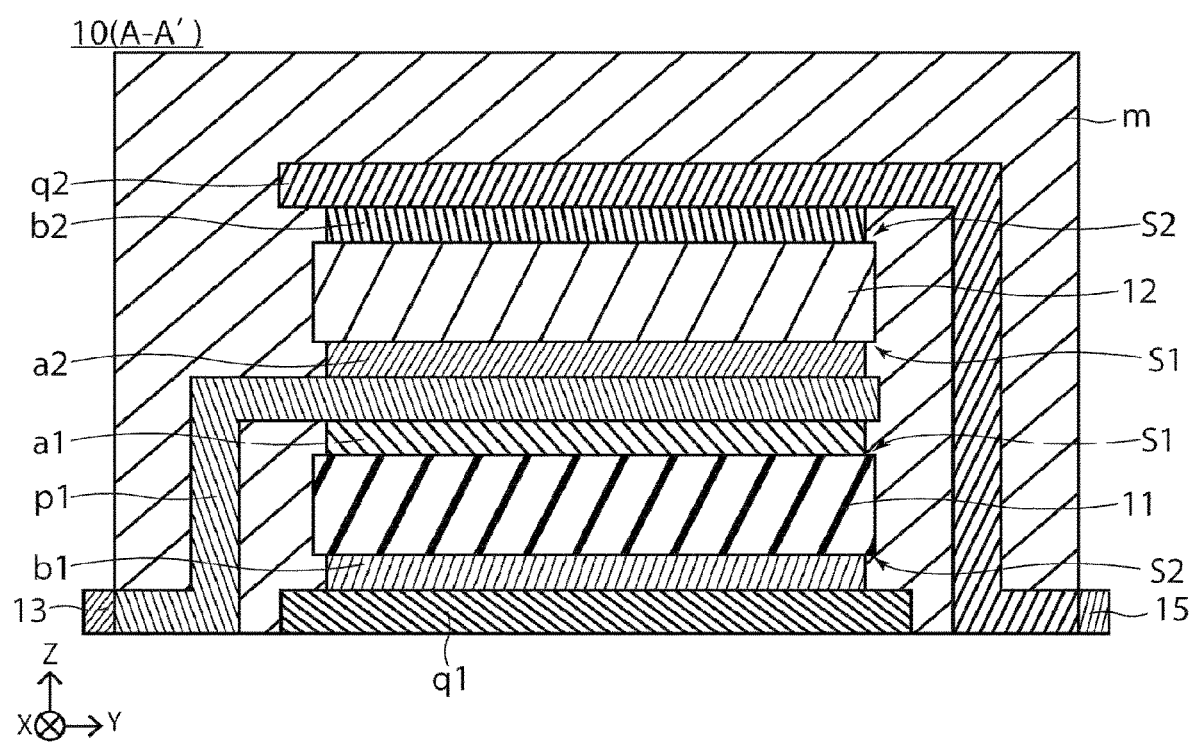
FIG. 16 is a schematic cross-sectional view of a semiconductor package according to an embodiment.
Figure 17:
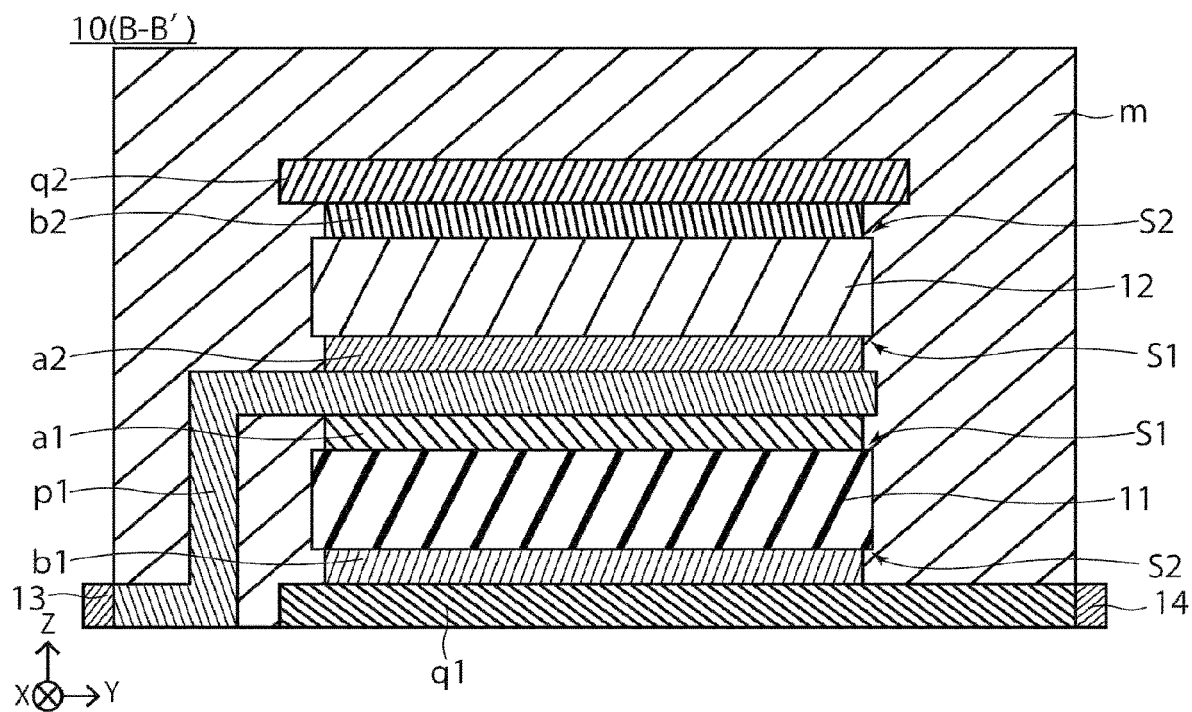
FIG. 17 is a schematic cross-sectional view of a semiconductor package according to an embodiment.

As illustrated in the cross-sectional views of FIGS. 16 and 17, the lead frame p1 is provided between the cathode electrode a1 and the cathode electrode a2. The lead frame p1 is connected to both the cathode of the first semiconductor element 11 and the cathode of the second semiconductor element 12. The lead frame p1 is preferably in contact with the cathode electrode a1 and the cathode electrode a2 and in direct contact therewith. As illustrated in FIGS. 16 and 17, the lead frame p1 extends toward the first common terminal 13. A portion of the lead frame p1 extends to a bottom surface side of the first semiconductor package 10. As illustrated in FIG. 5, the lead frame p1 is connected to the first common terminal 13 exposed outside the side surface of the semiconductor package 10.

As illustrated in FIGS. 16 and 17, the anode electrode b1 of the first semiconductor element 11 is located on the bottom surface side of the first semiconductor package 10. The anode electrode b1 is preferably in contact with the lead frame q1 and directly in contact therewith. The lead frame q1 is connected to the anode of the first semiconductor element 11, but is not connected to the anode of the second semiconductor element 12. As illustrated in FIGS. 6 to 8, the lead frame q1 is preferably exposed to the bottom surface side of the first semiconductor package 10. As illustrated in FIGS. 2 to 4, the lead frame q2 is connected to the first non-common terminal 14 exposed outside the side surface of the semiconductor package 10.

As illustrated in FIGS. 16 and 17, the anode electrode b2 of the second semiconductor element 12 is located on the upper surface side of the first semiconductor package 10. That is, the cathode electrode a1 and the cathode electrode a2 are positioned between the anode electrode b1 and the anode electrode b2. The anode electrode b2 is preferably in contact with the lead frame q2 and directly in contact therewith. The lead frame q2 is connected to the anode of the second semiconductor element 12, but is not connected to the lead frame q1 of the first semiconductor element 11. As illustrated in FIG. 5, the lead frame q2 extends while being bent toward the bottom surface side of the first semiconductor package 10. The lead frame q1 is independent of the lead frame q2. The lead frame q2 is connected to the second non-common terminal 15 exposed to the outside of the side surface of the first semiconductor package 10. The first non-common terminal 14 is independent of the second non-common terminal 15.

As illustrated in FIGS. 15 to 17, the lead frame q1 extends in parallel with the lead frame q2. As illustrated in FIGS. 15 to 17, the lead frame p1 extends to the side opposite to the lead frame q1 and the lead frame q2.

Second Embodiment

A second embodiment relates to a semiconductor device, specifically, a power converter. The second embodiment relates to a power converter 100 including a two-stone forward type DC-DC converter as a specific example using the first semiconductor package 10. In the power converter 100 of the second embodiment, a secondary-side circuit X2 includes a first semiconductor package 10. In the power converter 100 of the second embodiment, a case where a first semiconductor element 11 and a second semiconductor element 12 are MOSFETs is described as an example, but the first semiconductor element 11 and the second semiconductor element 12 may be IGBTs or diodes. In the second embodiment, it is preferable to use the first semiconductor package 10 described in the first embodiment.

Figure 18:
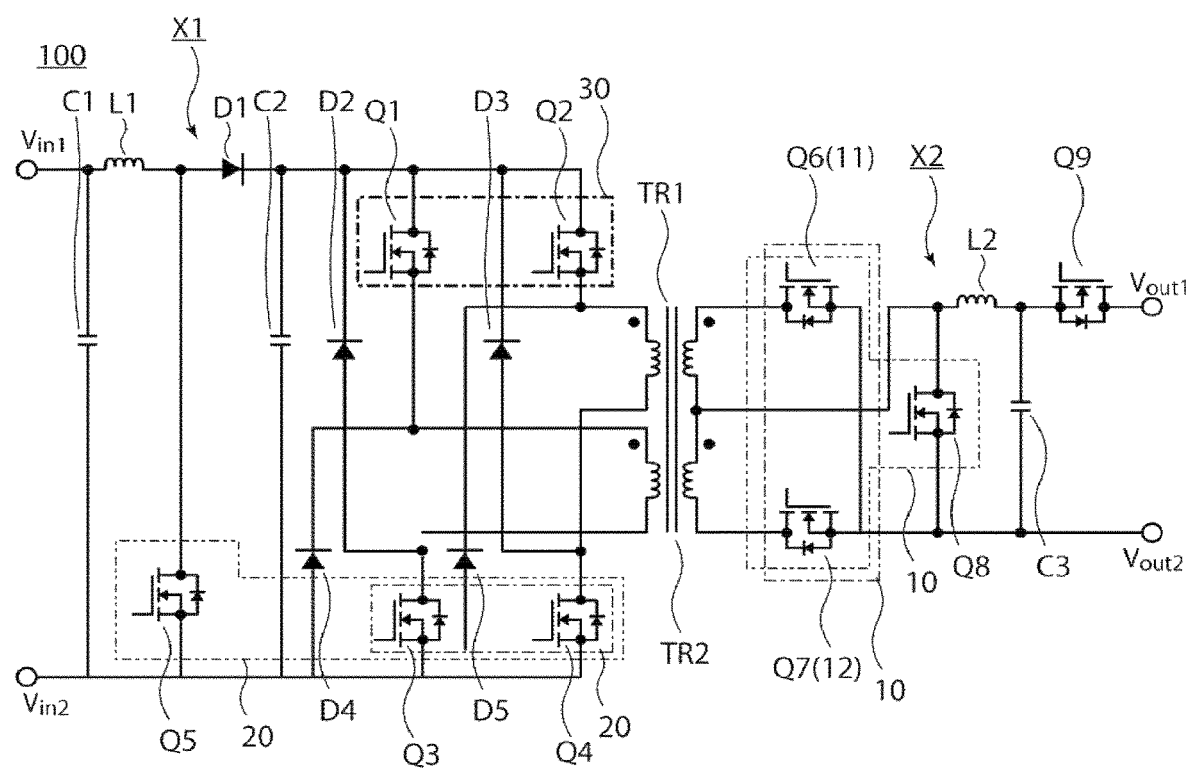
FIG. 18 is a circuit diagram according to an embodiment.

FIG. 18 is a circuit diagram of a two-stone forward type (two-stone double forward type) DC-DC converter according to a second embodiment. The circuit diagram illustrated in FIG. 18 is an example of a circuit diagram of a two-stone forward type DC-DC converter, and the circuit configuration can be appropriately changed. A primary-side circuit X1 includes switching elements Q1 to Q5, diodes D1 to D4, and capacitors C1 to C2, and is connected to primary coils of a first transformer TR1 and a second transformer TR2. The switching elements Q1 and Q3 and the switching elements Q2 and Q4 are alternately turned on and off. Each switching element of the primary-side circuit X1 is a MOSFET or an IGBT. Although a gate driver or an IGBT driver is connected to each switching element, illustration thereof is omitted.

The secondary-side circuit X2 includes switching elements Q6-Q9, a coil L2, and a capacitor C3, and is connected to secondary coils of the first transformer TR1 and the second transformer TR2. In the secondary-side circuit X2, the switching element Q6 and the switching element Q7 are alternately turned on and off.

In the two-stone forward type DC-DC converter, it is preferable to use the first semiconductor package 10 in which the switching element Q6 is accommodated as the first semiconductor element 11 and the switching element Q7 is accommodated as the second semiconductor element 12, or the switching element Q7 is accommodated as the first semiconductor element 11 and the switching element Q8 is accommodated as the second semiconductor element 12. In a case where the switching element Q6 and the switching element Q7 are MOSFETs, the first semiconductor package 10 in which the sources of the two switching elements Q6 and Q7 are connected to a low potential side output terminal $V_{out2}$ and the source terminals of the switching elements are shared can be adopted.

The source side of the switching element Q8 is also connected to the low potential side output terminal $V_{out2}$. Therefore, in addition to the switching element Q6 (first semiconductor element 11) and the switching element Q7 (second semiconductor element 12), the switching element Q8 can be accommodated as a third semiconductor element in the first semiconductor package 10. The source electrode of the third semiconductor element is also preferably connected to the lead frame p1, and is preferably electrically connected to a first common terminal 13.

The third semiconductor element is included in a first semiconductor element group. When the first semiconductor element 11 and the second semiconductor element are MOSFETs, the third semiconductor element is also a MOSFET. When the first semiconductor element 11 and the second semiconductor element 12 are IGBTs, the third semiconductor element is also an IGBT. The area of the third semiconductor element (the area of the element region) is preferably 50% or more and 150% or less, more preferably 75% or more and 125% or less, still more preferably 90% or more and 110% or less of the area of the first semiconductor element 11 (the area of the element region).

In the second embodiment, a second semiconductor package 20 accommodating the switching element Q3 and the switching element Q4 can be used. The second semiconductor package 20 accommodates a second semiconductor element group. When the switching element Q3 and the switching element Q4 of the second semiconductor package 20 are p-type MOSFETs, the configuration of the third semiconductor package is adopted for the second semiconductor package 20, and the lead frame sandwiched between the drain electrode b1 and the drain electrode b2 is connected to the low potential side input terminal $V_{in2}$.

Figure 19:
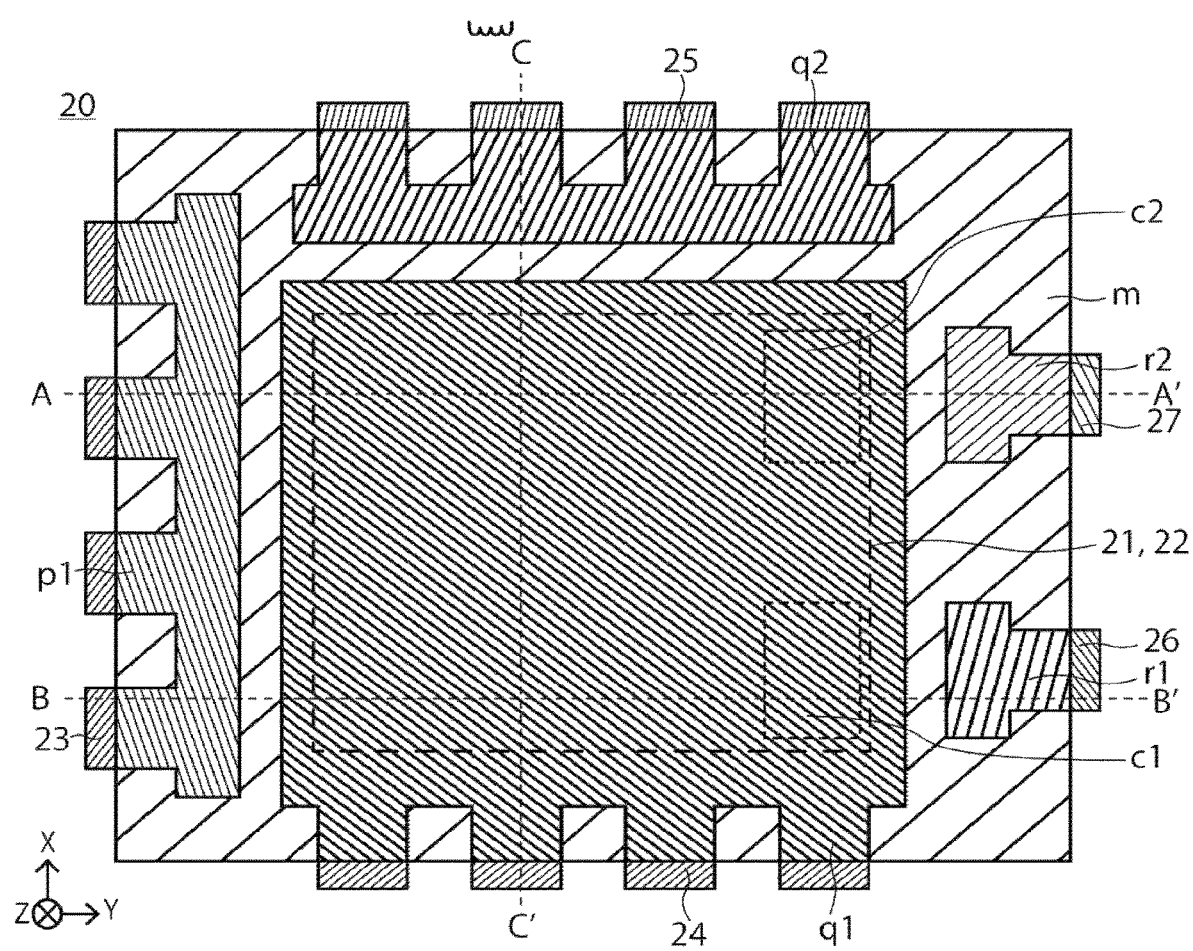
FIG. 19 is a schematic diagram of a semiconductor package according to an embodiment.

FIG. 19 is a schematic diagram of the second semiconductor package 20. The schematic diagram (X-Y plane) of FIG. 19 is a schematic diagram viewed from the bottom surface side which is the terminal side of the second semiconductor package 20. In addition, in the schematic diagram of FIG. 19, members and the like that are not visible from a portion of the bottom surface are also illustrated. The schematic cross-sectional view taken along line A-A' (Y-Z plane) in FIG. 19 corresponds to the schematic cross-sectional view taken along line A-A' (Y-Z plane) in FIG. 3. The schematic cross-sectional view taken along line B-B' (Y-Z plane) in FIG. 19 corresponds to the schematic cross-sectional view taken along line B-B' (X-Z plane) in FIG. 4. The schematic cross-sectional view taken along line C-C' (Y-Z plane) in FIG. 19 is a schematic cross-sectional view taken along line C-C' (X-Z plane) in FIG. 5.

The second semiconductor element group includes a fourth semiconductor element 21 and a fifth semiconductor element 22. The second semiconductor element group is a MOSFET or an IGBT. Hereinafter, a case where the second semiconductor element group is a MOSFET will be mainly described as an example. A case where the second semiconductor element group is an IGBT will also be partially described.

The second semiconductor package 20 accommodates the switching element Q3 as the fourth semiconductor element 21 and the switching element Q4 as the fifth semiconductor element 22, or accommodates the switching element Q4 as the fourth semiconductor element 21 and the switching element Q3 as the fifth semiconductor element 22. The second semiconductor package 20 includes a second common terminal 23, a third non-common terminal 24, a fourth non-common terminal 25, a gate terminal 26, and a gate terminal 27. The second common terminal 23 is electrically connected to the low potential side input terminal $V_{in2}$ of the primary-side circuit X1.

The fourth semiconductor element 21 corresponds to the first semiconductor element 11, and the fifth semiconductor element 22 corresponds to the second semiconductor element 12. The second common terminal 23, the third non-common terminal 24, and the fourth non-common terminal 25 of the second semiconductor package 20 correspond to the first common terminal 13, the first non-common terminal 14, and the second non-common terminal 15 of the first semiconductor package 10, respectively.

Since the first semiconductor package 10 and the second semiconductor package 20 are similar devices, the description thereof will be partially omitted. In the first semiconductor package 10 and the second semiconductor package 20, reference numerals of some members or names of some members are common. The description and the corresponding schematic diagram of the second semiconductor package 20 common to the first semiconductor package 10 will be omitted.

The second semiconductor package 20 may include a semiconductor element other than the fourth semiconductor element 21 and the fifth semiconductor element 22, for example, a sixth semiconductor element (for example, switching element Q5) having common source-side wires with the fourth semiconductor element 21 and the fifth semiconductor element 22.

The lead frame p1 (second lead frame) is provided between the fourth semiconductor element 21 and the fifth semiconductor element 22. The second common terminal 23 is connected to the lead frame p1. The third non-common terminal 24 is connected to the lead frame q1. The fourth non-common terminal 25 is connected to the lead frame q2. The gate terminal 26 is connected to the lead frame r1. The gate terminal 27 is connected to the lead frame r2.

When the second semiconductor element group is a MOSFET, the second semiconductor element group includes the lead frame p1 (second lead frame) in which the source electrode a1 of fourth semiconductor element 21 and the source electrode a2 of the fifth semiconductor element 22 face each other and are electrically connected to each other. The source electrode a1 of the fourth semiconductor element 21 and the source electrode a2 of the fifth semiconductor element 22 preferably face each other in the stacking direction of the fourth semiconductor element 21 and the fifth semiconductor element 22. A surface of the lead frame p1 of the second semiconductor package 20 facing the fourth semiconductor element 21 is directly connected to the source electrode a1 of the fourth semiconductor element 21. A surface of the lead frame p1 of the second semiconductor package 20 facing the fifth semiconductor element 22 is directly connected to the source electrode a2 of the fifth semiconductor element 22.

When the second semiconductor element group is an IGBT, the second semiconductor element group includes the lead frame p1 (second lead frame) in which the emitter electrode a1 of the fourth semiconductor element 21 and the emitter electrode a2 of the fifth semiconductor element 22 are electrically connected to face each other. The emitter electrode a1 of the fourth semiconductor element 21 and the emitter electrode a2 of fifth semiconductor element 22 preferably face each other in the stacking direction of the fourth semiconductor element 21 and the fifth semiconductor element 22. The surface of the lead frame p1 of the second semiconductor package 20 facing the fourth semiconductor element 21 is directly connected to the emitter electrode a1 of the fourth semiconductor element 21. The surface of the lead frame p1 of the second semiconductor package 20 facing the fifth semiconductor element 22 is directly connected to the emitter electrode a2 of the fifth semiconductor element 22.

The second semiconductor package 20 is also provided with the source electrode a1 and the source electrode a2 so as to sandwich the lead frame p1. Then, it is possible to achieve both of stacking the fourth semiconductor element 21 and the fifth semiconductor element 22 and connecting the sources of both semiconductor elements with one lead frame p1. The second semiconductor package 20 can be provided in a smaller area than a case where the two switching elements provided in the primary-side circuit X1 of the DC-DC converter are separately provided, and thus, the mounting area is reduced, which contributes to miniaturization of the power converter 100. That is, the power converter 100 using the second semiconductor package 20 can increase the power density. In a case where the fourth semiconductor element 21 and the fifth semiconductor element 22 are separately provided, a heat dissipation member such as a heat sink is used for each semiconductor element. However, by using the second semiconductor package 20 as in the embodiment, the heat dissipation member can also be made one, and the power converter 100 of the embodiment contributes to reducing the member cost and the mounting cost. Use of both the first semiconductor package 10 and the second semiconductor package 20 for the power converter 100 contributes to cost reduction. In the second semiconductor package 20, the second semiconductor package 20 can be freely designed except that the lead frame p1 is connected to both sources between two semiconductor elements.

In a case that fourth semiconductor element 21 and fifth semiconductor element 22 are complementarily turned on and off, when the area of fourth semiconductor element 21 and the area of fifth semiconductor element 22 are substantially equal to each other, the currents flowing through the two elements are substantially equal to each other, the temperature rises of the two elements are substantially the same, and the elements are less likely to be broken. That is, it is preferable that the element region area of fourth semiconductor element 21 and the element region area of fifth semiconductor element 22 are substantially the same. Specifically, the area of the fourth semiconductor element 21 (the area of the element region) is preferably 50% or more and 150% or less, more preferably 75% or more and 125% or less, still more preferably 90% or more and 110% or less of the area of the fifth semiconductor element 22 (the area of the element region).

In the second embodiment, the third semiconductor package 30 accommodating the switching element Q1 and the switching element Q2 can be used. The third semiconductor package 30 accommodates the third semiconductor element group. When the switching element Q1 and the switching element Q2 of the third semiconductor package 30 are p-type MOSFETs, the configuration of the second semiconductor package 20 is adopted for the third semiconductor package 30, and the lead frame sandwiched between the source electrode a1 and the source electrode a2 is connected to the high potential side input terminal $V_{in1}$.

Figure 20:
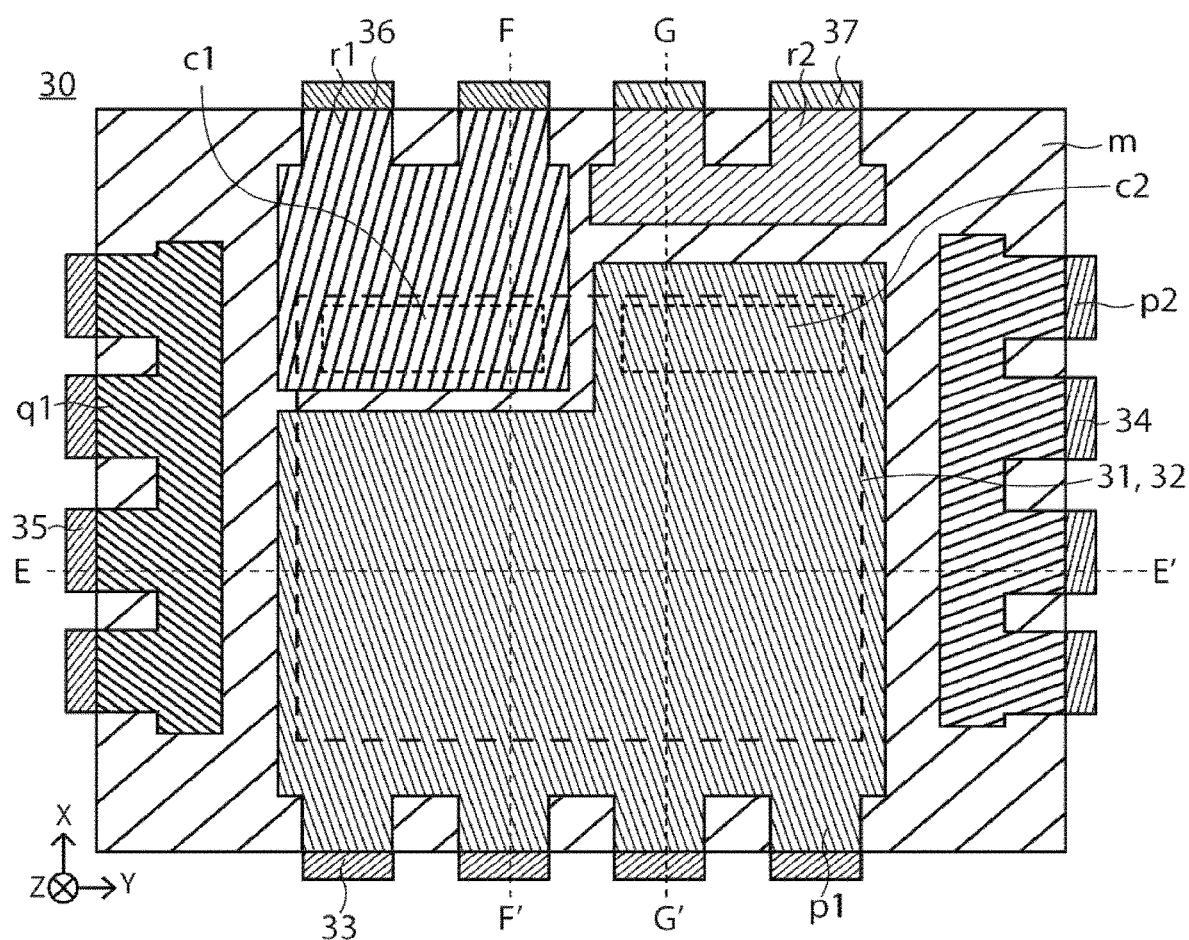
FIG. 20 is a schematic diagram of a semiconductor package according to an embodiment.
Figure 21:
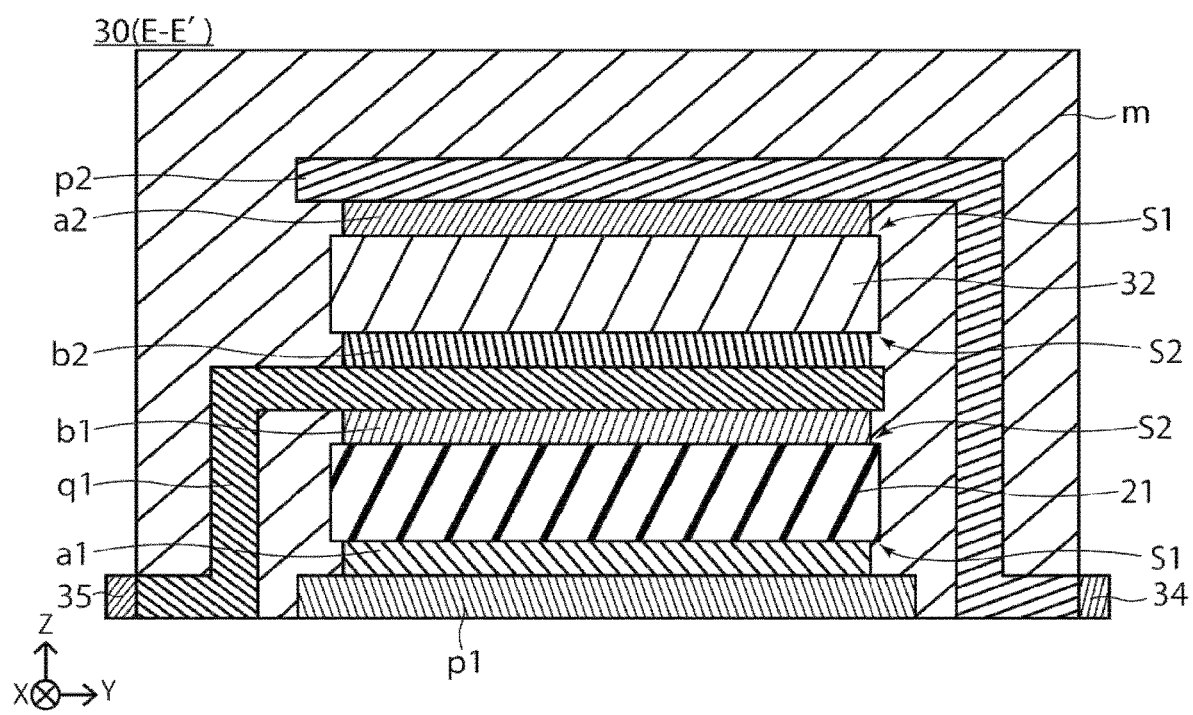
FIG. 21 is a schematic cross-sectional view of a semiconductor package according to an embodiment.
Figure 22:
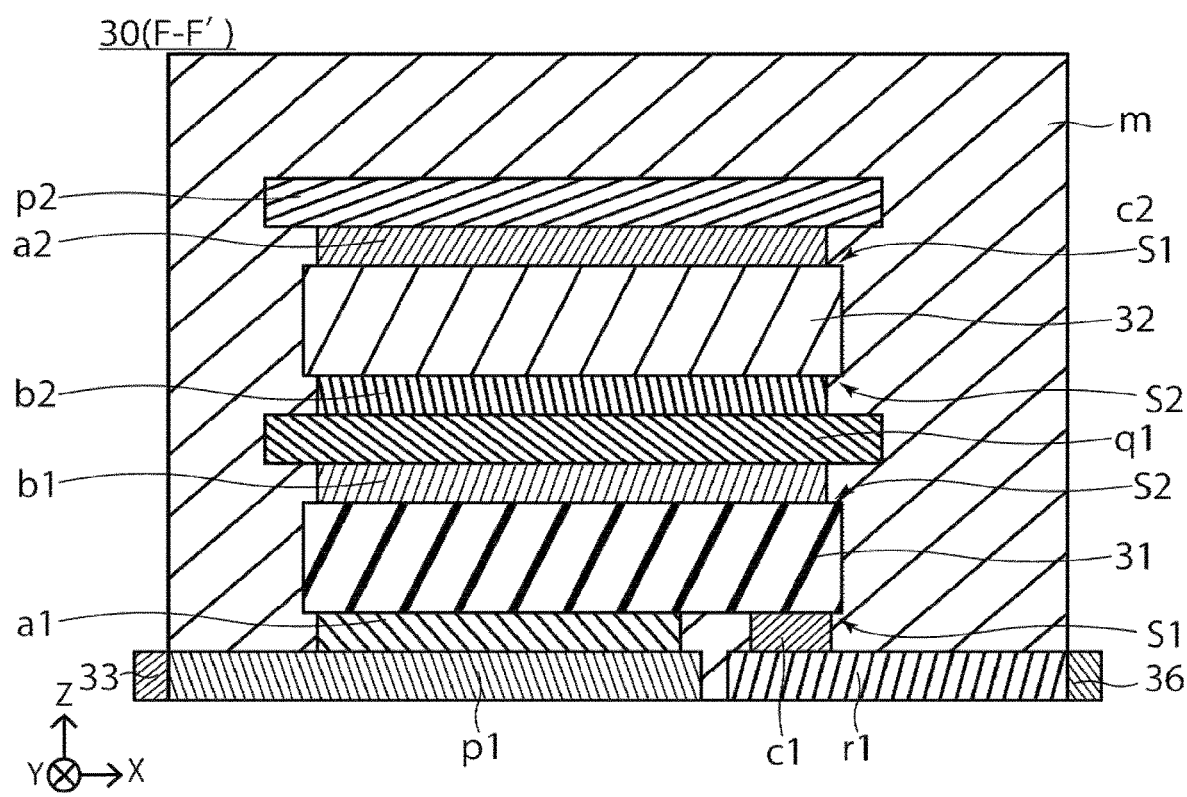
FIG. 22 is a schematic cross-sectional view of a semiconductor package according to an embodiment.

FIGS. 19 to 22 are schematic diagrams of the third semiconductor package 30. The schematic diagram (X-Y plane) of FIG. 19 is a schematic diagram viewed from the bottom surface side which is the terminal side of the second semiconductor package 20. In addition, in the schematic diagram of FIG. 19, members and the like that are not visible from a portion of the bottom surface are also illustrated. FIG. 20 is a schematic cross-sectional view taken along line E-E' (Y-Z plane) in FIG. 19. FIG. 21 is a schematic cross-sectional view taken along line F-F' (X-Z plane) in FIG. 19. FIG. 22 is a schematic cross-sectional view taken along line G-G' (X-Z plane) in FIG. 19.

The third semiconductor element group includes a seventh semiconductor element 31 and an eighth semiconductor element 32. The third semiconductor element group is a MOSFET or an IGBT. Hereinafter, a case where the third semiconductor element group is a MOSFET will be mainly described as an example. A case where the third semiconductor element group is an IGBT will also be partially described. When the third semiconductor element group is a MOSFET, the second semiconductor element group is also a MOSFET. When the third semiconductor element group is an IGBT, the second semiconductor element group is also an IGBT.

The third semiconductor package 30 accommodates the switching element Q1 as the seventh semiconductor element 31 and the switching element Q1 as the eighth semiconductor element 32, or accommodates the switching element Q1 as the seventh semiconductor element 31 and the switching element Q2 as the eighth semiconductor element 32. The third semiconductor package 30 includes a fifth non-common terminal 33, a sixth non-common terminal 34, a third common terminal 35, a gate terminal 36, and a gate terminal 37. The third common terminal 35 is electrically connected to the high potential side input terminal $V_{in1}$ of the primary-side circuit X1.

Since the third semiconductor package 30 is similar to the first semiconductor package 10 and the second semiconductor package 20, the description thereof will be partially omitted. In the first semiconductor package 10, the second semiconductor package 20, and the third semiconductor package 30, reference numerals of some members or names of some members are common. Description and corresponding schematic diagrams of contents common to the first semiconductor package 10 and/or the second semiconductor package 20 regarding the third semiconductor package 30 will be omitted. The third semiconductor package 30 is different from the first semiconductor package 10 and the second semiconductor package 20 in that the drain sides face each other.

The seventh semiconductor element 31 and the eighth semiconductor element 32 in the third semiconductor package 30 are stacked so as to be electrically connected in parallel.

The seventh semiconductor element 31 includes a source electrode a1, a drain electrode b1, and a gate electrode c1. The eighth semiconductor element 32 includes a source electrode a2, a drain electrode b2, and a gate electrode c2.

The source of the seventh semiconductor element 31 is electrically connected to the source of the seventh semiconductor element 31, and is provided on the surface (first surface S1) of the seventh semiconductor element 31. The source electrode a2 of the eighth semiconductor element 32 is electrically connected to the source of the eighth semiconductor element 32, and is provided on the surface (first surface S1) of the eighth semiconductor element 32.

The drain electrode b1 of the seventh semiconductor element 31 is electrically connected to the drain of the seventh semiconductor element 31, and is provided on the surface (second surface S2) of the seventh semiconductor element 31. The second surface S2 of the seventh semiconductor element 31 is a surface opposite to the first surface S1 of the seventh semiconductor element 31. The drain electrode b2 of the eighth semiconductor element 32 is electrically connected to the drain of the eighth semiconductor element 32, and is provided on the surface (second surface S2) of the eighth semiconductor element 32. The second surface S2 of the eighth semiconductor element 32 is a surface opposite to the first surface S1 of the eighth semiconductor element 32.

The gate electrode c1 of the seventh semiconductor element 31 is electrically connected to the gate of the seventh semiconductor element 31, and provided on the surface (first surface S1) of the seventh semiconductor element 31. The gate electrode c2 of the eighth semiconductor element 32 is electrically connected to the gate of the eighth semiconductor element 32, and is provided on the surface (first surface S1) of the eighth semiconductor element 32.

Each electrode of the seventh semiconductor element 31 and the eighth semiconductor element 32 includes an electrode pad or a conductive bonding member such as an electrode pad and solder.

The source electrode a1 of the seventh semiconductor element 31 and the source electrode a2 of the eighth semiconductor element 32 face in opposite directions toward the outside of the third semiconductor package 30.

The drain electrode b1 of the seventh semiconductor element 31 and the drain electrode b2 of the eighth semiconductor element 32 face each other and are electrically connected to each other in the stacking direction of the seventh semiconductor element 31 and the eighth semiconductor element 32.

The second surface S2 of the seventh semiconductor element 31 and the second surface S2 of the eighth semiconductor element 32 face each other, that is, the drain electrode b1 of the seventh semiconductor element 31 and the drain electrode b2 of the eighth semiconductor element 32 face each other while facing the inside of the third semiconductor package 30.

As illustrated in FIGS. 20 to 23, the source electrode a1 of the seventh semiconductor element 31 is located on the bottom surface side of the third semiconductor package 30. The source electrode a1 is preferably in contact with the lead frame p1 and directly in contact therewith. The lead frame p1 is connected to the source of the seventh semiconductor element 31, but is not connected to the source of the second semiconductor element 12. As illustrated in FIGS. 20 to 23, the lead frame p1 is preferably exposed to the bottom surface side of the third semiconductor package 30. As illustrated in FIGS. 20 to 23, the lead frame p1 is connected to the fifth non-common terminal 33 exposed outside the side surface of the semiconductor package 10.

As illustrated in FIGS. 20 to 23, the source electrode a2 of the eighth semiconductor element 32 is located on the upper surface side of the third semiconductor package 30. That is, the drain electrode b1 and the drain electrode b2 are positioned between the source electrode a1 and the source electrode a2. The source electrode a2 is preferably in contact with the lead frame p2 and directly in contact therewith. The lead frame p2 is connected to the source of the eighth semiconductor element 32, but is not connected to the lead frame p1 of the seventh semiconductor element 31. As illustrated in FIG. 21, the lead frame p2 extends while being bent toward the bottom surface direction of the third semiconductor package 30. The lead frame p1 is independent of the lead frame p2. The lead frame p2 is connected to the sixth non-common terminal 34 exposed outside the side surface of the third semiconductor package 30. The fifth non-common terminal 33 is independent of the sixth non-common terminal 34.

As illustrated in FIGS. 20 to 23, the lead frame p1 extends in a direction shifted by 60° with respect to the lead frame p2. As illustrated in FIGS. 20 to 23, the lead frame p2 extends in the direction opposite to the lead frame q1.

Figure 23:
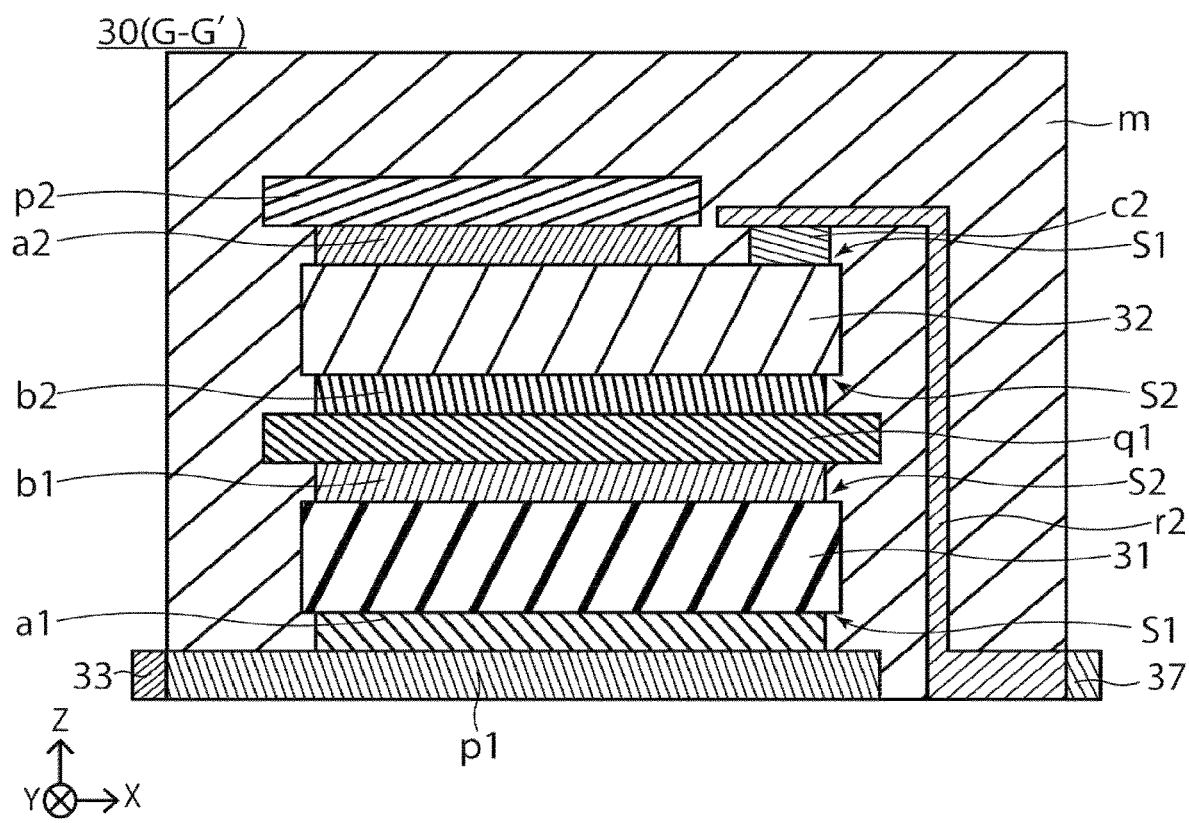
FIG. 23 is a schematic cross-sectional view of a semiconductor package according to an embodiment.

As illustrated in the cross-sectional views of FIGS. 21 to 23, the lead frame q1 (third lead frame) is provided between the drain electrode b1 and the drain electrode b2. The lead frame q1 is connected to both the drain of seventh semiconductor element 31 and the drain of eighth semiconductor element 32. It is preferable that the lead frame q1 is in contact with the drain electrode b1 and the drain electrode b2 and is in direct contact therewith. As illustrated in FIG. 21, the lead frame q1 extends toward the third common terminal 35. A portion of the lead frame q1 extends to the bottom surface side of the third semiconductor package 30. As illustrated in FIGS. 20 and 21, the lead frame q1 is connected to the third common terminal 35 exposed outside the side surface of the third semiconductor package 30.

As illustrated in FIGS. 20 and 22, the gate electrode c1 of the seventh semiconductor element 31 is adjacent to the source electrode a1 on the first surface S1 of the seventh semiconductor element 31. The gate electrode c1 is preferably in contact with a lead frame r1 and directly in contact therewith. The lead frame r1 is connected to the gate of the seventh semiconductor element 31, but is not connected to the gate of the eighth semiconductor element 32. As illustrated in FIGS. 20 and 22, the lead frame r1 extends along the bottom surface side of the third semiconductor package 30. The lead frame r1 is connected to the gate terminal 36 exposed outside the side surface of the third semiconductor package 30. A gate driver (not illustrated) is connected to the gate terminal 36. The operation of the seventh semiconductor element 31 is controlled by the gate driver.

As illustrated in FIGS. 20 and 23, the gate electrode c2 of the eighth semiconductor element 32 is adjacent to the source electrode a2 on the first surface S1 of the eighth semiconductor element 32. The gate electrode c2 is preferably in contact with the lead frame r2 and directly in contact therewith. The lead frame r2 is connected to the gate of the eighth semiconductor element 32, but is not connected to the gate of the seventh semiconductor element 31. As illustrated in FIG. 23, the lead frame r2 is bent and extends from the upper surface side to the bottom surface side of the third semiconductor package 30. The lead frame r2 is connected to the gate terminal 37 exposed outside the side surface of the third semiconductor package 30. A gate driver (not illustrated) is connected to the gate terminal 37. The operation of the eighth semiconductor element 32 is controlled by a gate driver.

As illustrated in FIGS. 20, 22, and 23, the lead frame r1 extends in parallel with the lead frame r2. As illustrated in FIGS. 20, 22, and 23, the lead frame r1 and the lead frame r2 extend in a direction shifted by 90° to the side opposite to the lead frame p1 with respect to the lead frame q1.

When the third semiconductor element group is a MOSFET, the third semiconductor element group includes a lead frame q1 (third lead frame) in which the drain electrode b1 of the seventh semiconductor element 31 and the drain electrode b2 of the eighth semiconductor element 32 are electrically connected to face each other. The drain electrode b1 of the seventh semiconductor element 31 and the drain electrode b2 of the eighth semiconductor element 32 preferably face each other in the stacking direction of the seventh semiconductor element 31 and the eighth semiconductor element 32. A surface of the lead frame q1 of the third semiconductor package 30 facing the seventh semiconductor element 31 is directly connected to the drain electrode b1 of the seventh semiconductor element 31. The surface of the lead frame q2 of the third semiconductor package 30 facing the eighth semiconductor element 32 is directly connected to the drain electrode b2 of the eighth semiconductor element 32.

When the third semiconductor element group is an IGBT, the IGBT includes a lead frame q1 (third lead frame) in which the collector electrode b1 of the seventh semiconductor element 31 and the collector electrode b2 of the eighth semiconductor element 32 are electrically connected to face each other. Preferably, the collector electrode b1 of the seventh semiconductor element 31 and the collector electrode b2 of the eighth semiconductor element 32 face each other in the stacking direction of the seventh semiconductor element 31 and the eighth semiconductor element 32. A surface of the lead frame q1 of the third semiconductor package 30 facing the seventh semiconductor element 31 is directly connected to the collector electrode b1 of the seventh semiconductor element 31. A surface of lead frame q1 of the third semiconductor package 30 facing the eighth semiconductor element 32 is directly connected to the collector electrode b2 of the eighth semiconductor element 32.

In the third semiconductor package 30, the drain electrode b1 and the drain electrode b2 are provided so as to sandwich the lead frame q1. Then, it is possible to achieve both of stacking the seventh semiconductor element 31 and the eighth semiconductor element 32 and connecting the drains of both the semiconductor elements with one lead frame q1. The third semiconductor package 30 can be provided in a smaller area than in a case where the two switching elements provided in the primary-side circuit X1 of the DC-DC converter are separately provided, and thus, the mounting area is reduced, which contributes to miniaturization of the power converter 100. That is, the power converter 100 using the third semiconductor package 30 can increase the power density. In a case where the seventh semiconductor element 31 and the eighth semiconductor element 32 are separately provided, a heat dissipation member such as a heat sink is used for each semiconductor element. However, by using the third semiconductor package 30 as in the embodiment, the heat dissipation member can also be made one, and the power converter 100 of the embodiment contributes to reducing the member cost and the mounting cost. Use of all of the first semiconductor package 10, the second semiconductor package 20, and the third semiconductor package 30 for the power converter 100 contributes to the cost reduction. In the third semiconductor package 30, the third semiconductor package 30 can be freely designed except that the lead frame q1 is connected to both drains between two semiconductor elements.

In the case that the seventh semiconductor element 31 and the eighth semiconductor element 32 are complementarily turned on and off, when the area of the seventh semiconductor element 31 and the area of the eighth semiconductor element 32 are substantially equal to each other, the currents flowing through the two elements are substantially the same, the temperature rises of the two elements are substantially the same, and the elements are less likely to be broken. That is, it is preferable that the element region area of the seventh semiconductor element 31 and the element region area of the eighth semiconductor element 32 are substantially the same. Specifically, the area of the seventh semiconductor element 31 (the area of the element region) is preferably 50% or more and 150% or less, more preferably 75% or more and 125% or less, still more preferably 90% or more and 110% or less of the area of the eighth semiconductor element 32 (the area of the element region).

Third Embodiment

A third embodiment relates to a semiconductor device, specifically, a power converter. The third embodiment relates to a power converter including a half-bridge type DC-DC converter. In the power converter 100 of the third embodiment, a secondary-side circuit X2 includes a first semiconductor package 10. In the power converter 100 of the third embodiment, a case where a first semiconductor element 11 and a second semiconductor element 12 are MOSFETs is described as an example, but the first semiconductor element 11 and the second semiconductor element 12 may be IGBTs or diodes. In the third embodiment, it is preferable to use the first semiconductor package 10 described in the first embodiment and the second embodiment.

Figure 24:
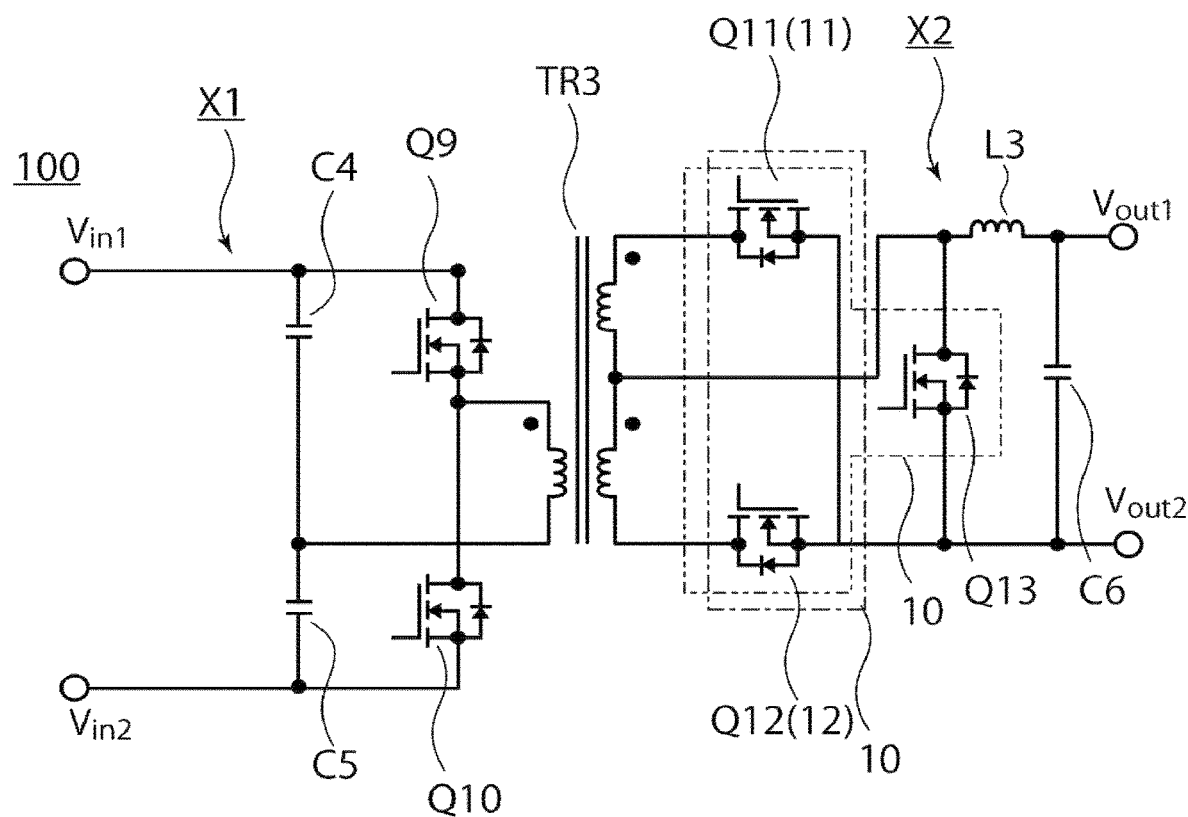
FIG. 24 is a circuit diagram according to an embodiment.

FIG. 24 is a circuit diagram of the half-bridge type DC-DC converter according to a third embodiment. The circuit diagram illustrated in FIG. 24 is an example of a circuit diagram of the half-bridge type DC-DC converter, and the circuit configuration can be appropriately changed.

The primary-side circuit X1 includes switching elements Q9 and Q10 and capacitors C4 and C5, and is connected to a primary coil of a third transformer TR3. The switching element Q9 and the switching element Q10 are alternately turned on and off. Each switching element of the primary-side circuit X1 is a MOSFET or an IGBT. Although a gate driver or an IGBT driver is connected to each switching element, illustration thereof is omitted.

The secondary-side circuit X2 includes switching elements Q11 and Q12, a coil L3, and a capacitor C6, and is connected to a secondary coil of the third transformer TR3. In the secondary-side circuit X2, the switching element Q11 and the switching element Q12 are alternately turned on and off.

In the half-bridge type DC-DC converter, it is preferable to use the first semiconductor package 10 in which the switching element Q11 is accommodated as the first semiconductor element 11 and the switching element Q12 is accommodated as the second semiconductor element 12, or the switching element Q12 is accommodated as the first semiconductor element 11 and the switching element Q11 is accommodated as the second semiconductor element 12. When the switching element Q11 and the switching element Q12 are MOSFETs, the first semiconductor package 10 in which the sources of the two switching elements Q11 and Q12 are connected to the low potential side output terminal $V_{out2}$ and the source terminals of these switching elements are common can be adopted.

A source side of a switching element Q13 is also connected to the low potential side output terminal $V_{out2}$. Therefore, in the first semiconductor package 10, in addition to the switching element Q11 (first semiconductor element 11) and the switching element Q12 (second semiconductor element 12), the switching element Q13 can be accommodated as a third semiconductor element. The source electrode of the third semiconductor element is also preferably connected to the lead frame p1, and is preferably electrically connected to a first common terminal 13.

In the third embodiment, by adopting the first semiconductor package 10, the power converter 100 of the embodiment contributes to reducing the member cost and the mounting cost. In the first semiconductor package 10, the semiconductor package 10 can be freely designed except that the lead frame p1 is connected to both sources between two semiconductor elements.

Fourth Embodiment

A fourth embodiment relates to a semiconductor device, specifically, a power converter. The fourth embodiment relates to a power converter including a full-bridge type DC-DC converter. In a power converter 100 of the fourth embodiment, a secondary-side circuit X2 includes a first semiconductor package 10. Further, a second semiconductor package 20 and a third semiconductor package 30 are preferably used for a primary-side circuit X1. In the power converter 100 of the fourth embodiment, a case where a first semiconductor element 11 and a second semiconductor element 12 are MOSFETs is described as an example, but the first semiconductor element 11 and the second semiconductor element 12 may be IGBTs or diodes. In the third embodiment, it is preferable to use the first semiconductor package 10 described in the first embodiment and the second embodiment. In the third embodiment, it is preferable to use the second semiconductor package 20 and/or the third semiconductor package 30 described in the second embodiment.

Figure 25:
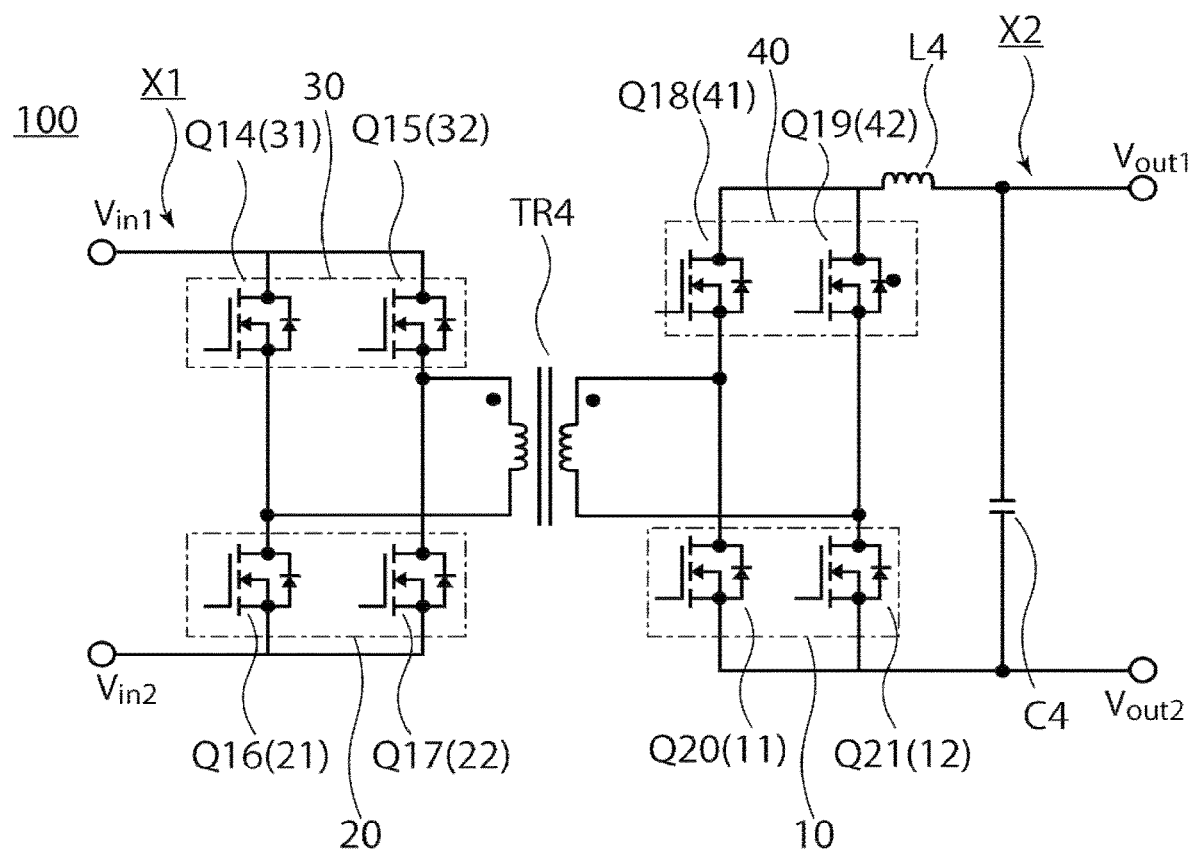
FIG. 25 is a circuit diagram according to an embodiment.

FIG. 25 is a circuit diagram of a full-bridge type DC-DC converter according to a third embodiment. The circuit diagram illustrated in FIG. 25 is an example of a circuit diagram of a full-bridge type DC-DC converter, and the circuit configuration can be appropriately changed.

The primary-side circuit X1 includes switching elements Q14 to Q17 and is connected to a primary coil of a fourth transformer TR4. The switching elements Q14 and Q16 and the switching elements Q15 and Q17 are alternately turned on and off. Each switching element of the primary-side circuit X1 is a MOSFET or an IGBT. Although a gate driver or an IGBT driver is connected to each switching element, illustration thereof is omitted.

The secondary-side circuit X2 includes switching elements Q18 to Q21, a coil L4, and a capacitor C1, and is connected to the secondary coil of the fourth transformer TR4. In the secondary-side circuit X2, the switching elements Q18 and Q20 and the switching elements Q19 and Q20 are alternately turned on and off.

In the full-bridge type DC-DC converter, it is preferable to use the first semiconductor package 10 in which the switching element Q20 is accommodated as the first semiconductor element 11 and the switching element Q21 is accommodated as the second semiconductor element 12, or the switching element Q21 is accommodated as the first semiconductor element 11 and the switching element Q20 is accommodated as the second semiconductor element 12. When the switching element Q20 and the switching element Q21 are MOSFETs, the first semiconductor package 10 in which the sources of the two switching elements Q20 and Q21 are connected to a low potential side output terminal $V_{out2}$ and the source terminals of these switching elements are shared can be adopted.

In the full-bridge type DC-DC converter, it is preferable to use the second semiconductor package 20 in which the switching element Q16 is accommodated as the fourth semiconductor element 21 and the switching element Q17 is accommodated as the fifth semiconductor element 22, or the switching element Q17 is accommodated as the fourth semiconductor element 21 and the switching element Q16 is accommodated as the fifth semiconductor element 22. When the switching element Q16 and the switching element Q17 are MOSFETs, the second semiconductor package 20 in which the sources of the two switching elements Q16 and Q17 are connected to a low potential side input terminal $V_{in2}$ and the source terminals of these switching elements are shared can be adopted.

In the full-bridge type DC-DC converter, it is preferable to use the third semiconductor package 30 in which the switching element Q14 is accommodated as the seventh semiconductor element 31 and the switching element Q15 is accommodated as the eighth semiconductor element 32, or the switching element Q15 is accommodated as the seventh semiconductor element 31 and the switching element Q14 is accommodated as the eighth semiconductor element 32. In a case where the switching element Q14 and the switching element Q15 are MOSFETs, the third semiconductor package 30 in which the drains of the two switching elements Q14 and Q15 are connected to a high potential side input terminal $V_{in1}$ and the drain terminals of these switching elements are shared can be adopted.

In the fourth embodiment, a fourth semiconductor package 40 accommodating the switching element Q18 and the switching element Q19 can be used. The fourth semiconductor package 40 accommodates a fourth semiconductor element group.

Figure 26:
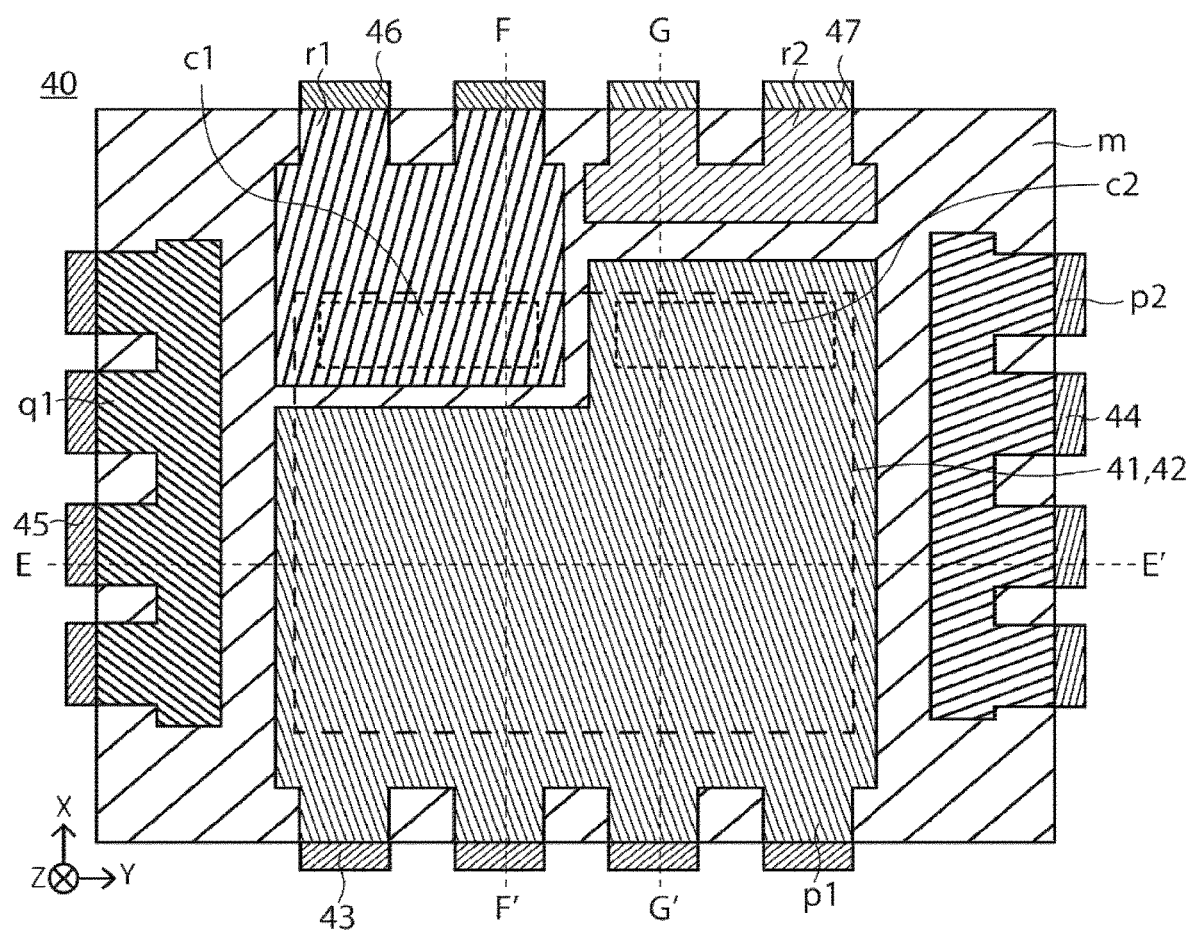
FIG. 26 is a schematic diagram of a semiconductor package according to an embodiment.

FIG. 26 is a schematic diagram of the fourth semiconductor package 40. The schematic diagram (X-Y plane) of FIG. 26 is a schematic diagram viewed from the bottom surface side which is the terminal side of the fourth semiconductor package 40. In addition, in the schematic diagram of FIG. 26, members and the like that are not visible from a portion of the bottom surface are also illustrated. The schematic cross-sectional view taken along line E-E' (Y-Z plane) in FIG. 26 corresponds to the schematic cross-sectional view taken along line E-E' (Y-Z plane) in FIG. 20. The schematic cross-sectional view taken along line F-F' (Y-Z plane) in FIG. 26 corresponds to the schematic cross-sectional view taken along line F-F' (X-Z plane) in FIG. 21. The schematic cross-sectional view taken along line G-G' (Y-Z plane) in FIG. 26 is a schematic cross-sectional view taken along line G-G' (X-Z plane) in FIG. 22.

The fourth semiconductor element group includes a ninth semiconductor element 41 and a tenth semiconductor element 42. The fourth semiconductor element group is a MOSFET, an IGBT, or a diode. When the first semiconductor element group is a MOSFET, the fourth semiconductor element group is also a MOSFET. When the first semiconductor element group is an IGBT, the fourth semiconductor element group is also an IGBT. When the first semiconductor element group is a diode, the fourth semiconductor element group is also a diode. Hereinafter, a case where the fourth semiconductor element group is a MOSFET will be mainly described as an example. A case where the fourth semiconductor element group is an IGBT or a diode will also be partially described.

The fourth semiconductor package 40 accommodates the switching element Q18 as the ninth semiconductor element 41 and the switching element Q19 as the tenth semiconductor element 42, or accommodates the switching element Q19 as the ninth semiconductor element 41 and the switching element Q18 as the tenth semiconductor element 42. The fourth semiconductor package 40 includes a seventh non-common terminal 43, an eighth non-common terminal 44, a fourth common terminal 45, a gate terminal 46, and a gate terminal 47. The fourth common terminal 45 is electrically connected to a high potential side output terminal $V_{out1}$ of the secondary-side circuit X2.

The ninth semiconductor element 41 of the fourth semiconductor package 40 corresponds to the seventh semiconductor element 31 of the third semiconductor package 30. The tenth semiconductor element 42 of the fourth semiconductor package 40 corresponds to the eighth semiconductor element 32 of the third semiconductor package 30. The seventh non-common terminal 43, the eighth non-common terminal 44, and the fourth common terminal 45 of the fourth semiconductor package 40 correspond to the fifth non-common terminal 33, the sixth non-common terminal 34, and the third common terminal 35 of the third semiconductor package 30, respectively.

Since the third semiconductor package 30 and the fourth semiconductor package 40 are similar devices, the description thereof will be partially omitted. In the first semiconductor package 10 to the fourth semiconductor package 40, reference numerals of some members or names of some members are common. The description and the corresponding schematic diagram of the fourth semiconductor package 40 common to the third semiconductor package 30 will be omitted.

The lead frame q1 (fourth lead frame) is provided between the ninth semiconductor element 41 and the tenth semiconductor element 42. The fourth common terminal 45 is connected to the lead frame q1. The seventh non-common terminal 43 is connected to the lead frame p1. The eighth non-common terminal 44 is connected to the lead frame p2. The gate terminal 46 is connected to the lead frame r1. The gate terminal 47 is connected to the lead frame r2.

When the fourth semiconductor element group is a MOSFET, the fourth semiconductor element includes a lead frame q1 (fourth lead frame) in which the drain electrode b1 of the ninth semiconductor element 41 and the drain electrode b2 of the tenth semiconductor element 42 are electrically connected to face each other. It is preferable that the drain electrode b1 of the ninth semiconductor element 41 and the drain electrode b2 of the tenth semiconductor element 42 face each other in the stacking direction (Z direction) of the ninth semiconductor element 41 and the tenth semiconductor element 42. A surface of lead frame q1 of fourth semiconductor package 40 facing ninth semiconductor element 41 is directly connected to drain electrode b1 of ninth semiconductor element 41. The surface of the lead frame q1 of the fourth semiconductor package 40 facing the tenth semiconductor element 42 is directly connected to the drain electrode b2 of the tenth semiconductor element 42.

When the fourth semiconductor element group is an IGBT, the IGBT includes the lead frame q1 (fourth lead frame) in which the collector electrode b1 of the ninth semiconductor element 41 and the collector electrode b2 of the tenth semiconductor element 42 are electrically connected to face each other. It is preferable that the collector electrode b1 of the ninth semiconductor element 41 and the collector electrode b2 of the tenth semiconductor element 42 face each other in the stacking direction of the ninth semiconductor element 41 and the tenth semiconductor element 42. A surface of lead frame q1 of fourth semiconductor package 40 facing ninth semiconductor element 41 is directly connected to collector electrode 101 of ninth semiconductor element 41. A surface of lead frame q1 of fourth semiconductor package 40 facing tenth semiconductor element 42 is directly connected to the collector electrode b2 of tenth semiconductor element 42.

In the fourth semiconductor package 40, the drain electrode b1 and the drain electrode b2 are provided so as to sandwich the lead frame q1. This makes it possible to achieve both of stacking the ninth semiconductor element 41 and the tenth semiconductor element 42 and connecting the drains of both semiconductor elements by one lead frame q1. The third semiconductor package 30 can be provided in a smaller area than in a case where the two switching elements provided in the primary-side circuit X1 of the DC-DC converter are separately provided, and thus, the mounting area is reduced, which contributes to miniaturization of the power converter 100. That is, the power converter 100 using the fourth semiconductor package 40 can increase the power density. In a case where the ninth semiconductor element 41 and the tenth semiconductor element 42 are separately provided, a heat dissipation member such as a heat sink is used for each semiconductor element. However, by using the fourth semiconductor package 40 as in the embodiment, the heat dissipation member can also be made one, and the power converter 100 of the embodiment contributes to reducing the member cost and the mounting cost. Use of all of the first semiconductor package 10, the second semiconductor package 20, and the third semiconductor package 30 for the power converter 100 contributes to the cost reduction. In the fourth semiconductor package 40, the fourth semiconductor package 40 can be freely designed except that the lead frame q1 is connected to both drains between two semiconductor elements.

In the case that ninth semiconductor element 41 and the tenth semiconductor element 42 are complementarily turned on and off, when the area of ninth semiconductor element 41 and the area of the tenth semiconductor element 42 are substantially equal to each other, the currents flowing through the two elements are substantially equal to each other, the temperature rises of the two elements are substantially the same, and the elements are less likely to be broken. That is, it is preferable that the element region area of the ninth semiconductor element 41 and the element region area of the tenth semiconductor element 42 are substantially the same. Specifically, the area of the ninth semiconductor element 41 (the area of the element region) is preferably 50% or more and 150% or less, more preferably 75% or more and 125% or less, still more preferably 90% or more and 110% or less of the area of the tenth semiconductor element 42 (the area of the element region).

In the fourth embodiment, a p-type MOSFET or a p-channel type MOSFET can also be used. For example, when p-type MOSFETs are used for all semiconductor elements, the configuration of the fourth semiconductor package 40 is adopted for the first semiconductor package 10, the lead frame sandwiched between the drain electrode b1 and the drain electrode b2 is connected to the low potential side output terminal $V_{out2}$, the configuration of the third semiconductor package 30 is adopted for the second semiconductor package 20, the lead frame sandwiched between the drain electrode b1 and the drain electrode b2 is connected to the low potential side input terminal $V_{in2}$, the configuration of the second semiconductor package 20 is adopted for the third semiconductor package 30, the lead frame sandwiched between the source electrode a1 and the source electrode a2 is connected to the high potential side input terminal $V_{in1}$, the configuration of the first semiconductor package 10 is adopted for the fourth semiconductor package 40, the lead frame sandwiched between the source electrode a1 and the source electrode a2 is connected to the high potential side output terminal $V_{out1}$, and thus, the semiconductor package of the present disclosure can be used for the power converter 100.

Fifth Embodiment

Figure 27:
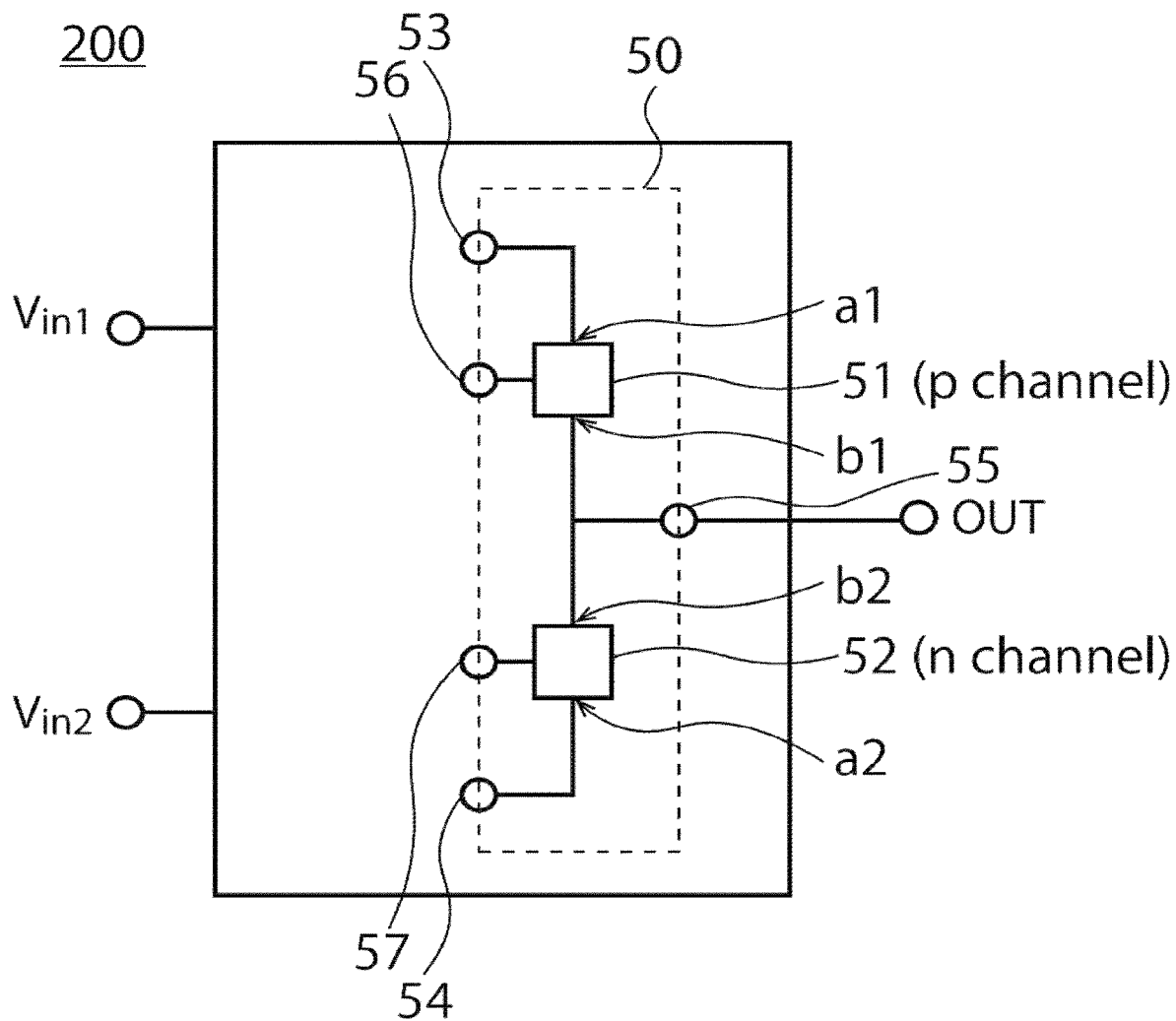
FIG. 27 is a schematic diagram of a semiconductor device according to an embodiment.

A fifth embodiment relates to a semiconductor device, specifically, a power converter or a signal amplifier including an inverter circuit. More specifically, the power converter is an inverter. FIG. 27 illustrates a schematic circuit diagram of a semiconductor device 200 according to the embodiment. In a case where the semiconductor device 200 is a signal amplifier, a signal input terminal to which an amplified signal is input is further provided. The schematic circuit diagram of FIG. 27 includes a fifth semiconductor package 50 accommodating an eleventh semiconductor element 51 and a twelfth semiconductor element 52.

The fifth semiconductor package 50 accommodates a fifth semiconductor element group including the eleventh semiconductor element 51 and the twelfth semiconductor element 52. In the fifth semiconductor package 50, the eleventh semiconductor element 51 and the twelfth semiconductor element 52 are stacked, the fifth semiconductor element group is an IGBT, a bipolar transistor, a MOSFET, or an FET, the eleventh semiconductor element 51 is a semiconductor element of a p-channel type, the twelfth semiconductor element 52 is a semiconductor element of a n-channel type, when the fifth semiconductor element group is an IGBT or a bipolar transistor, a collector electrode of the eleventh semiconductor element 51 and a collector electrode of the twelfth semiconductor element 52 are electrically connected to face each other in a stacking direction of the eleventh semiconductor element 51 and the twelfth semiconductor element 52, and when the fifth semiconductor element group is a MOSFET or an FET, the fifth semiconductor package 50 includes a fifth lead frame in which a drain electrode of the eleventh semiconductor element 51 and a drain electrode of the twelfth semiconductor element 52 are electrically connected to face each other in the stacking direction of the eleventh semiconductor element 51 and the twelfth semiconductor element 52. The fifth lead frame is located between the eleventh semiconductor element 51 and the twelfth semiconductor element 52.

The semiconductor device 200 includes a high potential side input terminal $V_{in1}$ and a low potential side input terminal $V_{in2}$, and is connected to a DC power supply. A DC voltage is applied to the fifth semiconductor package 50, and an AC current or an amplified signal converted by the fifth semiconductor package 50 is output from an output terminal OUT.

The fifth semiconductor package 50 accommodates the fifth semiconductor element group including the eleventh semiconductor element 51 and the twelfth semiconductor element 52. The fifth semiconductor package 50 may include a semiconductor element other than the eleventh semiconductor element 51 and the twelfth semiconductor element 52. The fifth semiconductor package 50 includes a fifth common terminal 55. The fifth semiconductor package 50 includes a ninth non-common terminal 53 connected to the eleventh semiconductor element 51 and a tenth non-common terminal 54 connected to the twelfth semiconductor element 52.

The eleventh semiconductor element 51 and the twelfth semiconductor element 52 are both bipolar transistors, both IGBTs, both MOSFETs, or both FETs.

When the fifth semiconductor package 50 is accommodated in an IGBT module or an operational amplifier, a sealing material m can be omitted.

The eleventh semiconductor element 51 is a semiconductor element of a p-channel type, and the twelfth semiconductor element 52 is a semiconductor element of an n-channel type. The eleventh semiconductor element 51 and the twelfth semiconductor element 52 are preferably complementary pairs.

FIGS. 28 to 31 are schematic diagrams of the fifth semiconductor package 50. The stacking direction of the eleventh semiconductor element 51 and the twelfth semiconductor element 52 is defined as a Z direction, and a direction perpendicular to the Z direction is defined as an X direction and a Y direction. The X direction and the Y direction are orthogonal to each other. A surface of the eleventh semiconductor element 51 facing the twelfth semiconductor element 52 is preferably parallel to an X-Y plane. A surface of twelfth semiconductor element 52 facing eleventh semiconductor element 51 is preferably parallel to the X-Y plane.

Figure 28:
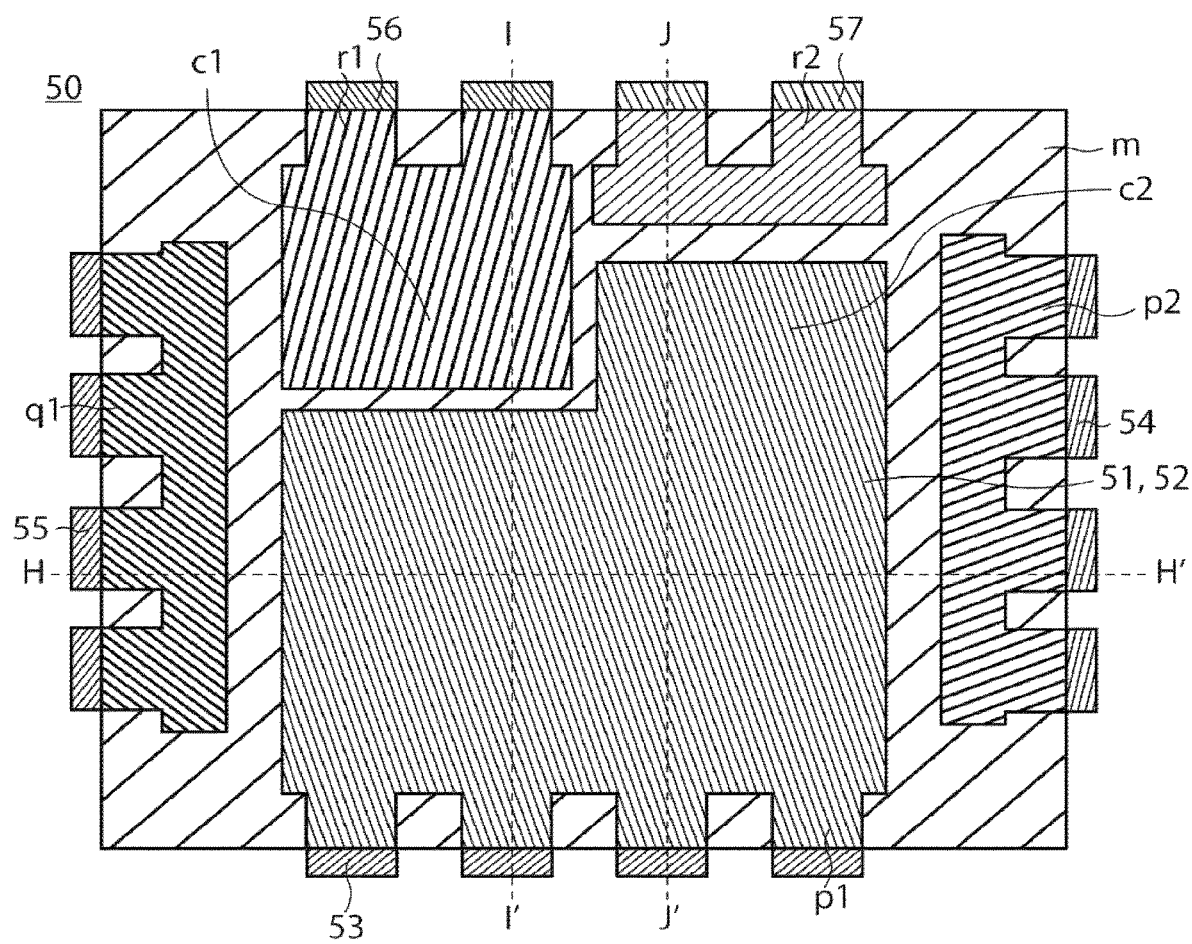
FIG. 28 is a schematic diagram of a semiconductor package according to an embodiment.
Figure 29:
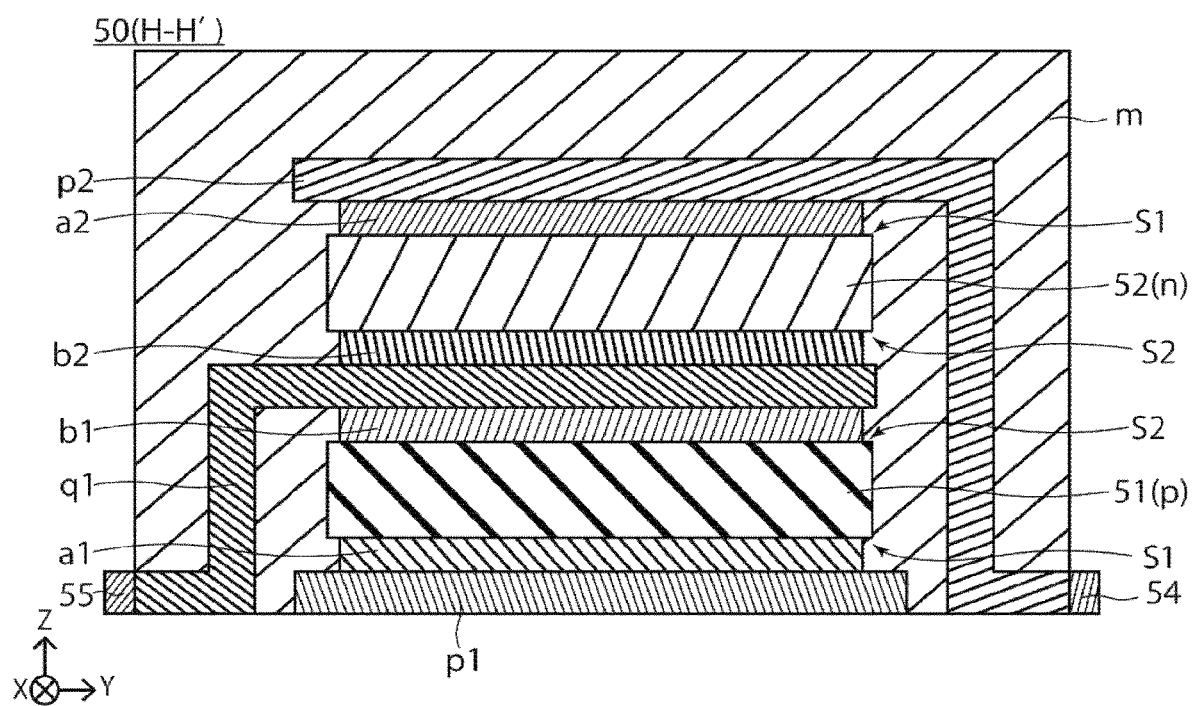
FIG. 29 is a schematic diagram of a semiconductor package according to an embodiment.

In the schematic diagram of FIG. 28, although the eleventh semiconductor element 51 is located on the lower side and the twelfth semiconductor element 52 is located on the upper side, a fifth semiconductor package 50 in which the eleventh semiconductor element 51 is located on the upper side and the twelfth semiconductor element 52 is located on the lower side may be used.

Figure 30:
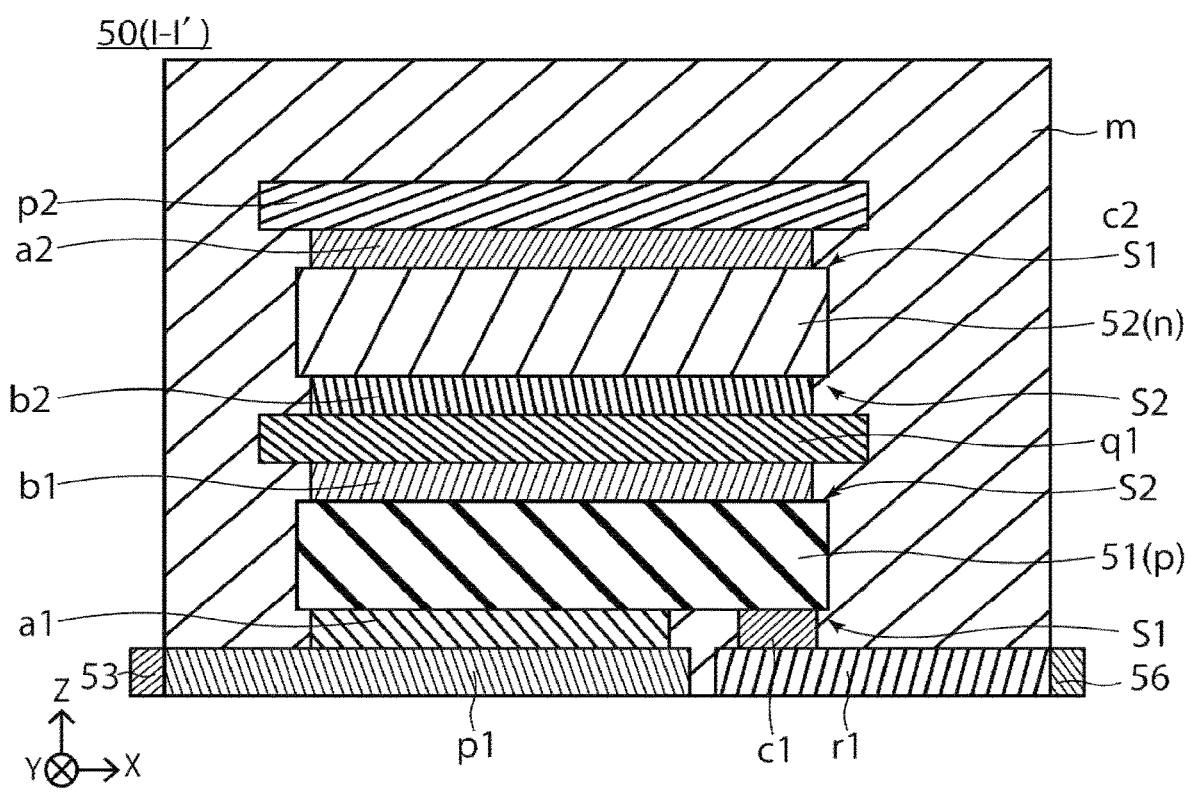
FIG. 30 is a schematic diagram of a semiconductor package according to an embodiment.
Figure 31:
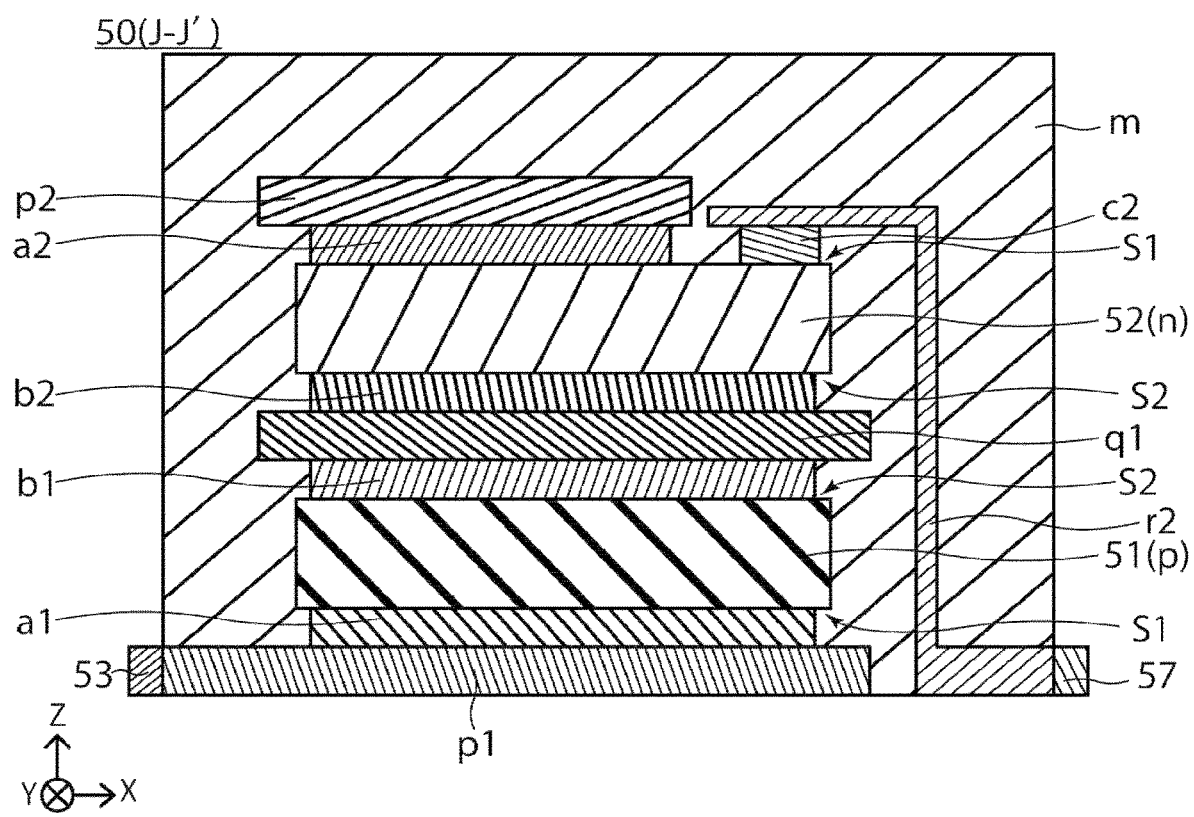
FIG. 31 is a schematic diagram of a semiconductor package according to an embodiment.

The schematic diagram (X-Y plane) of FIG. 28 is a schematic diagram viewed from the bottom surface side which is the terminal side of the fifth semiconductor package 50. Furthermore, in the cross-sectional view of FIG. 28, members and the like that are not visible from a portion of the bottom surface are also illustrated. FIG. 9 is a schematic cross-sectional view taken along line H-H' (Y-Z plane) in FIG. 29. FIG. 30 is a schematic cross-sectional view taken along line I-I' (Y-Z plane) in FIG. 2. FIG. 31 is a schematic cross-sectional view taken along line J-J' (X-Z plane) in FIG. 28.

The eleventh semiconductor element 51 and the twelfth semiconductor element 52 in the fifth semiconductor package 50 are stacked so as to be electrically connected in series.

In the fifth semiconductor package 50, the third semiconductor package 30 and the fourth semiconductor package 40 are similar devices, and thus the description thereof will be partially omitted. In the first semiconductor package 10 to the fourth semiconductor package 40, reference numerals of some members or names of some members are common. Description and corresponding schematic diagrams of contents common to the third semiconductor package 30 and the fourth semiconductor package 40 regarding the fifth semiconductor package 50 will be omitted.

The eleventh semiconductor element 51 of the fifth semiconductor package 50 corresponds to the seventh semiconductor element 31 of the third semiconductor package 30. The twelfth semiconductor element 52 of the fifth semiconductor package 50 corresponds to the eighth semiconductor element 32 of the third semiconductor package 30. The ninth non-common terminal 53, the tenth non-common terminal 54, and the fifth common terminal 55 of the fifth semiconductor package 50 correspond to the fifth non-common terminal 33, the sixth non-common terminal 34, and the third common terminal 35 of the third semiconductor package 30, respectively.

A lead frame q1 (fifth lead frame) is provided between the eleventh semiconductor element 51 and the twelfth semiconductor element 52. The fifth common terminal 55 is connected to the lead frame q1. The ninth non-common terminal 53 is connected to the lead frame p1. The tenth non-common terminal 54 is connected to the lead frame p2. A base terminal 56 is connected to the lead frame r1. A base terminal 57 is connected to the lead frame r2.

When the fifth semiconductor element group is an IGBT or a bipolar transistor, the fifth semiconductor element group includes the lead frame q1 (fifth lead frame) in which a collector electrode b1 of the eleventh semiconductor element 51 and a collector electrode b2 of the twelfth semiconductor element 52 are electrically connected to face each other. The collector electrode b1 of the eleventh semiconductor element 51 and the collector electrode b2 of the twelfth semiconductor element 52 preferably face each other in the stacking direction of the eleventh semiconductor element 51 and the twelfth semiconductor element 52. A surface of the lead frame q1 of the fifth semiconductor package 50 facing the eleventh semiconductor element 51 is directly connected to the collector electrode b1 of the eleventh semiconductor element 51. A surface of the lead frame q1 of the fifth semiconductor package 50 facing the twelfth semiconductor element 52 is directly connected to the collector electrode b2 of the twelfth semiconductor element 52.

When the fifth semiconductor element group is a MOSFET or an FET, the semiconductor device includes the lead frame q1 (fifth lead frame) in which the drain electrode b1 of the eleventh semiconductor element 51 and the drain electrode b2 of the twelfth semiconductor element 52 are electrically connected to face each other. It is preferable that the drain electrode b1 of the eleventh semiconductor element 51 and the drain electrode b2 of the twelfth semiconductor element 52 face each other in the stacking direction (Z direction) of the eleventh semiconductor element 51 and the twelfth semiconductor element 52. A surface of the lead frame q1 of the fifth semiconductor package 50 facing the eleventh semiconductor element 51 is directly connected to the drain electrode b1 of the eleventh semiconductor element 51. A surface of the lead frame q1 of the fifth semiconductor package 50 facing the tenth semiconductor element 42 is directly connected to the drain electrode b2 of the tenth semiconductor element 42.

In the fifth semiconductor package 50, the drain electrode b1 and the drain electrode b2 are provided so as to sandwich the lead frame q1. Then, it is possible to achieve both of stacking the eleventh semiconductor element 51 and the twelfth semiconductor element 52 and connecting the drains of both semiconductor elements with one lead frame q1. The fifth semiconductor package 50 can be provided in a smaller area than a case where two switching elements are separately provided, and thus, the mounting area is reduced, which contributes to miniaturization of the semiconductor device 200. That is, the semiconductor device 200 using the fifth semiconductor package 50 can increase the power density. In a case where the eleventh semiconductor element 51 and the twelfth semiconductor element 52 are separately provided, a heat dissipation member such as a heat sink is used for each semiconductor element. However, by using the fifth semiconductor package 50 as in the embodiment, the heat dissipation member can also be made one, and the power converter 100 of the embodiment contributes to reducing the member cost and the mounting cost. In the fifth semiconductor package 50, the fourth semiconductor package 40 can be freely designed except that the lead frame q1 is connected to both drains between two semiconductor elements.

In a case where the eleventh semiconductor element 51 and the twelfth semiconductor element 52 are turned on and off, when the area of the eleventh semiconductor element 51 and the area of the twelfth semiconductor element 52 are substantially the same, the currents flowing through the two elements are substantially the same, the temperature rises of the two elements are substantially the same, and the elements are less likely to be broken. That is, the element region area of the eleventh semiconductor element 51 and the element region area of the twelfth semiconductor element 52 are preferably substantially the same. Specifically, the area of the eleventh semiconductor element 51 (the area of the element region) is preferably 50% or more and 150% or less, more preferably 75% or more and 125% or less, still more preferably 90% or more and 110% or less of the area of the twelfth semiconductor element 52 (the area of the element region).

Sixth Embodiment

A sixth embodiment relates to a semiconductor device, specifically, a power converter. A sixth embodiment relates to a power converter including an inverter. A power converter 200 of the sixth embodiment includes a fifth semiconductor package 50. In the power converter 200 according to the sixth embodiment, a case where an eleventh semiconductor element 51 and a twelfth semiconductor element 52 are IGBTs is described as an example.

Figure 32:
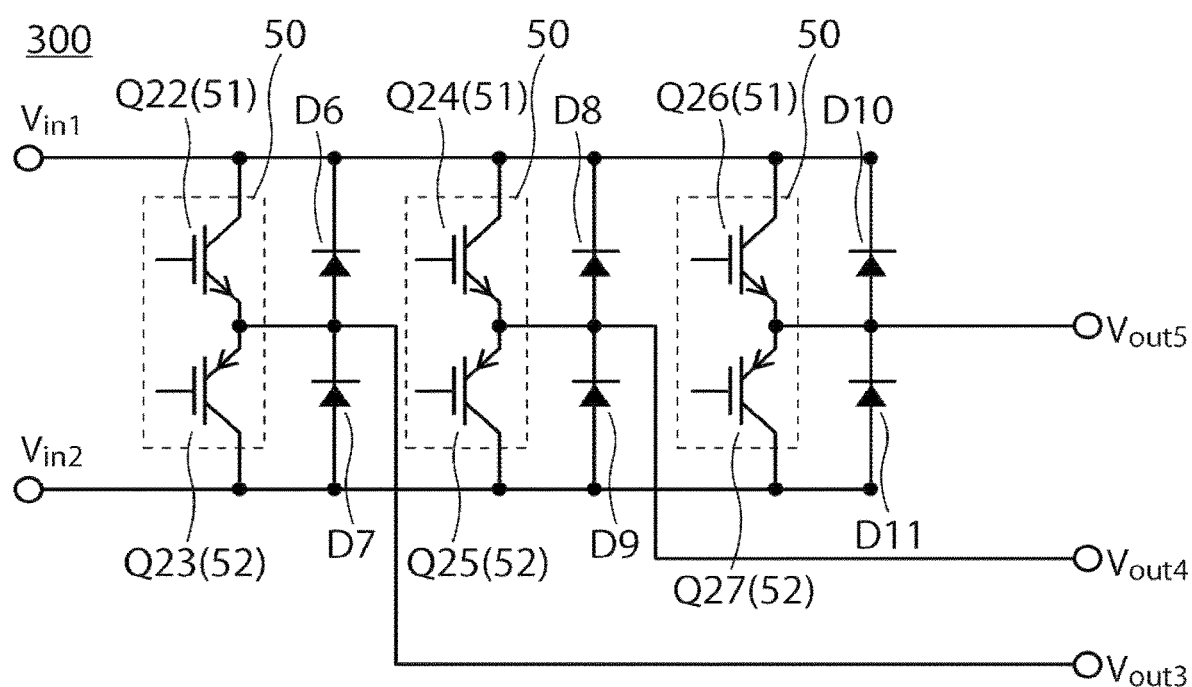
FIG. 32 is a circuit diagram according to an embodiment.

FIG. 32 is a circuit diagram of a three-phase inverter according to the sixth embodiment. The circuit diagram illustrated in FIG. 32 is an example of a circuit diagram of the three-phase inverter, and the circuit configuration can be appropriately changed.

A three-phase inverter circuit illustrated in FIG. 32 includes switching elements Q22 to Q27 and diodes D6 to D11. The diode is connected in parallel to each switching element. Although a gate driver or an IGBT driver is connected to each switching element, illustration thereof is omitted.

Since the inverter is a three-phase inverter, three pairs of a switching element of a p-channel type and a switching element of an n-channel type are included, and are connected to an output terminal $V_{out3}$, an output terminal $V_{out4}$, and an output terminal $V_{out5}$, respectively. Each output terminal is connected to, for example, a three-phase motor.

In the three-phase inverter, it is preferable to use the fifth semiconductor package 50 accommodating the switching element Q22 as the eleventh semiconductor element 51 and the switching element Q23 as the twelfth semiconductor element 52.

In the three-phase inverter, it is preferable to use the fifth semiconductor package 50 accommodating the switching element Q24 as the eleventh semiconductor element 51 and the switching element Q25 as the twelfth semiconductor element 52.

In the three-phase inverter, it is preferable to use the fifth semiconductor package 50 accommodating the switching element Q26 as the eleventh semiconductor element 51 and the switching element Q27 as the twelfth semiconductor element 52.

For example, the fifth semiconductor package 50 in which a collector of the switching element Q22 and a collector of the switching element Q23 are connected to the output terminal $V_{out3}$ and the collector terminals of these switching elements are shared can be adopted.

A diode can also be accommodated in the fifth semiconductor package 50. Accommodating the plurality of fifth semiconductor packages 50 in the IGBT module contributes to miniaturization of the IGBT module. The adoption of the fifth semiconductor package 50 contributes to miniaturization of the device adopting the fifth semiconductor package 50, and contributes to reduction in member cost and mounting cost.

Seventh Embodiment

A seventh embodiment relates to a semiconductor device, specifically, a signal amplifier. A signal amplifier 300 of the seventh embodiment includes a fifth semiconductor package 50. In the signal amplifier 300 according to the seventh embodiment, a case where an eleventh semiconductor element 51 and a twelfth semiconductor element 52 are bipolar transistors is described as an example.

Figure 33:
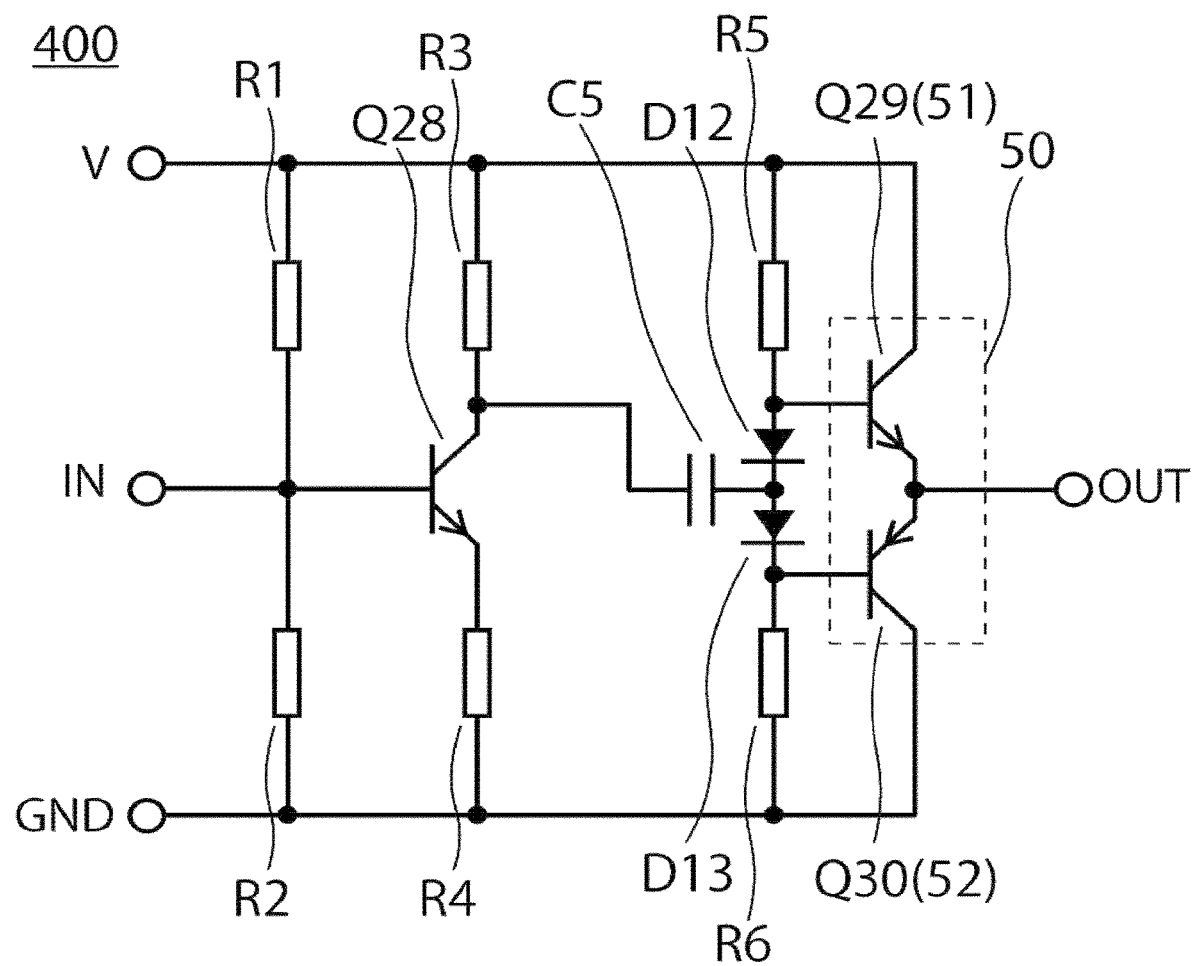
FIG. 33 is a circuit diagram according to an embodiment.

FIG. 33 is a circuit diagram of the signal amplifier 300 according to a seventh embodiment. The circuit diagram illustrated in FIG. 33 is an example of a circuit diagram of the signal amplifier 300, and the circuit configuration can be appropriately changed.

A circuit of the signal amplifier 300 illustrated in FIG. 33 includes switching elements Q28 and Q29, diodes D12 to D13, and resistors R1 to R6. A DC power supply is connected between V and GND to the signal amplifier 300. A signal input from an input terminal IN of the signal amplifier 300 is amplified by the signal amplifier 300 and output from an output terminal OUT.

In the signal amplifier 300, it is preferable to use the fifth semiconductor package 50 accommodating the switching element Q29 as the eleventh semiconductor element 51 and the switching element Q30 as the twelfth semiconductor element 52.

For example, a fifth semiconductor package 50 in which a collector of the switching element Q29 and a collector of the switching element Q30 are connected to the output terminal OUT and collector terminals of these switching elements are shared can be adopted.

The adoption of the fifth semiconductor package 50 contributes to miniaturization of the device adopting the fifth semiconductor package 50, and contributes to reduction in member cost and mounting cost.

Eighth Embodiment

An eighth embodiment relates to a semiconductor device, specifically, a signal amplifier. A signal amplifier 500 of the eighth embodiment includes a fifth semiconductor package 50. In a power converter 200 according to the eighth embodiment, a case where an eleventh semiconductor element 51 and a twelfth semiconductor element 52 are bipolar transistors is described as an example.

Figure 34:
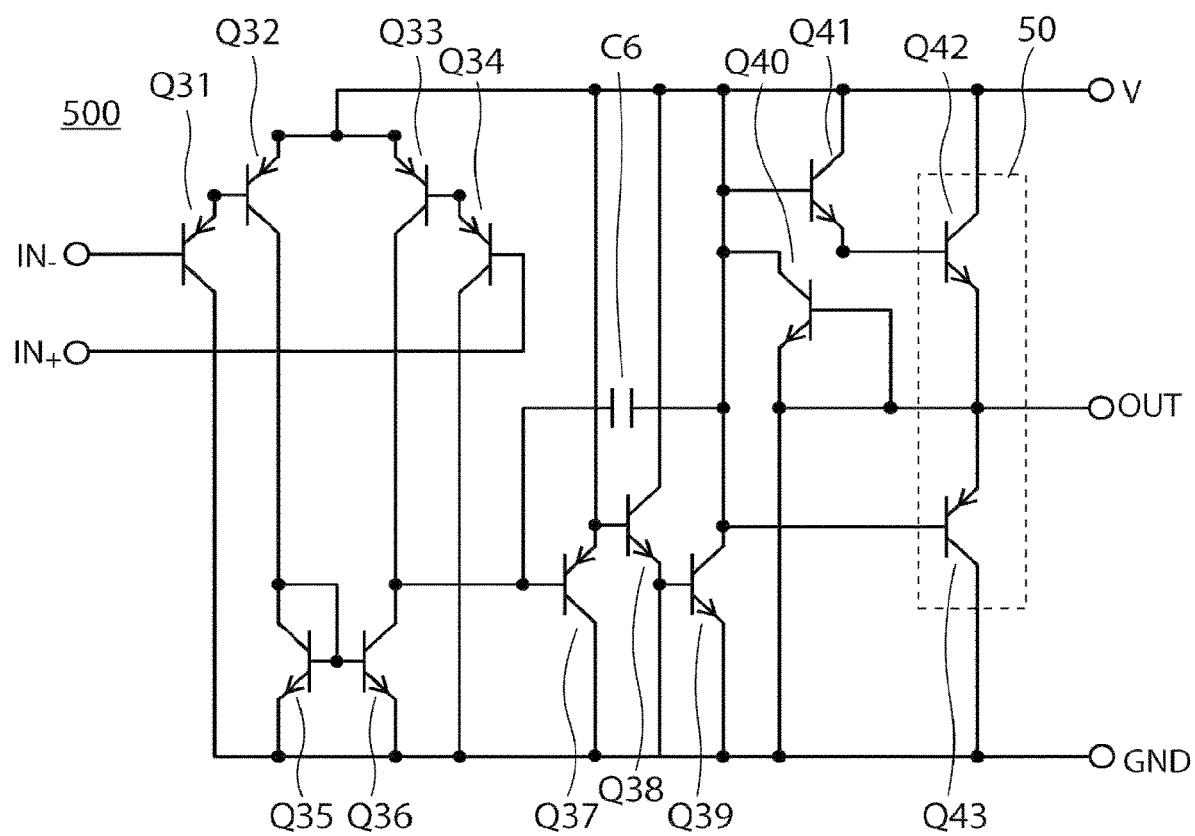
FIG. 34 is a circuit diagram according to an embodiment.

FIG. 34 is a circuit diagram of the signal amplifier 500 according to an eighth embodiment. More specifically, the signal amplifier 500 is an operational amplifier. The circuit diagram illustrated in FIG. 34 is an example of a circuit diagram of the signal amplifier 500, and the circuit configuration can be appropriately changed.

A circuit of the signal amplifier 500 illustrated in FIG. 34 includes switching elements Q31 to Q43 and a capacitor C6. A DC power supply is connected between V and GND to the signal amplifier 500. Signals input from input terminals $IN_+$ and $IN_-$ of the signal amplifier 500 are amplified by the signal amplifier 500 and output from an output terminal OUT.

In the signal amplifier 500, it is preferable to use the fifth semiconductor package 50 accommodating the switching element Q42 as the eleventh semiconductor element 51 and the switching element Q43 as the twelfth semiconductor element 52.

For example, the fifth semiconductor package 50 in which the collector of the switching element Q42 and the collector of the switching element Q43 are connected to the output terminal OUT and collector terminals of these switching elements are shared can be adopted.

The adoption of the fifth semiconductor package 50 contributes to miniaturization of the device adopting the fifth semiconductor package 50, and contributes to reduction in member cost and mounting cost.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising
a DC-DC converter including a primary-side circuit and a secondary-side circuit including a first semiconductor package accommodating a first semiconductor element group including a first semiconductor element and a second semiconductor element,
wherein the first semiconductor element and the second semiconductor element are stacked,
the first semiconductor element group is a MOSFET, an IGBT, or a diode, and
when the first semiconductor element group is the MOSFET, a source electrode of the first semiconductor element and a source electrode of the second semiconductor element are electrically connected to face each other in a stacking direction of the first semiconductor element and the second semiconductor element, and when the first semiconductor element group is the IGBT, an emitter electrode of the first semiconductor element and an emitter electrode of the second semiconductor element are electrically connected to face each other in the stacking direction of the first semiconductor element and the second semiconductor element, or when the first semiconductor element group is the diode, a first lead frame in which a cathode electrode of the first semiconductor element and a cathode electrode of the second semiconductor element are electrically connected to face each other in the stacking direction of the first semiconductor element and the second semiconductor element is included in the first semiconductor package,
the first lead frame is positioned between the first semiconductor element and the second semiconductor element,
the first semiconductor package includes a first common terminal connected to the first lead frame, and
the first common terminal is electrically connected to a low potential side output terminal of the secondary-side circuit.

2. The semiconductor device according to claim 1, wherein when the first semiconductor element group is the MOSFET, the first lead frame is in contact with the source electrode of the first semiconductor element and the source electrode of the second semiconductor element,
when the first semiconductor element group is the IGBT, the first lead frame is in contact with the emitter electrode of the first semiconductor element and the emitter electrode of the second semiconductor element, and
when the first semiconductor element group is the diode, the first lead frame is in contact with the cathode electrode of the first semiconductor element and the cathode electrode of the second semiconductor element.

3. The semiconductor device according to claim 2, wherein the DC-DC converter is a two-stone forward converter, a half-bridge converter, or a full-bridge converter.

4. A semiconductor device comprising:
a DC-DC converter including a primary-side circuit and a secondary-side circuit including a first semiconductor package accommodating a first semiconductor element group including a first semiconductor element and a second semiconductor element; and
a third semiconductor element in the first semiconductor package,
wherein the first semiconductor element and the second semiconductor element are stacked,
the first semiconductor element group is a MOSFET, an IGBT, or a diode, and
when the first semiconductor element group is the MOSFET, a source electrode of the first semiconductor element and a source electrode of the second semiconductor element are electrically connected to face each other in a stacking direction of the first semiconductor element and the second semiconductor element, and when the first semiconductor element group is the IGBT, an emitter electrode of the first semiconductor element and an emitter electrode of the second semiconductor element are electrically connected to face each other in the stacking direction of the first semiconductor element and the second semiconductor element, or when the first semiconductor element group is the diode, a first lead frame in which a cathode electrode of the first semiconductor element and a cathode electrode of the second semiconductor element are electrically connected to face each other in the stacking direction of the first semiconductor element and the second semiconductor element is included in the first semiconductor package,
the first lead frame is positioned between the first semiconductor element and the second semiconductor element,
the third semiconductor element is included in the first semiconductor element group,
when the first semiconductor element group is the MOSFET, a source electrode of the third semiconductor element is electrically connected to a first common terminal,
when the first semiconductor element group is the IGBT, the third semiconductor element is an IGBT and an emitter electrode of the third semiconductor element is electrically connected to the first common terminal, and
when the first semiconductor element group is the diode, the third semiconductor element is the diode and a cathode electrode of the third semiconductor element is electrically connected to the first common terminal.

5. A semiconductor device comprising:
a DC-DC converter including a primary-side circuit and a secondary-side circuit including a first semiconductor package accommodating a first semiconductor element group including a first semiconductor element and a second semiconductor element, and a second semiconductor package in which a second semiconductor element group including a fourth semiconductor element and a fifth semiconductor element is accommodated in the primary-side circuit,
wherein the first semiconductor element and the second semiconductor element are stacked,
the first semiconductor element group is a MOSFET, an IGBT, or a diode, and
when the first semiconductor element group is the MOSFET, a source electrode of the first semiconductor element and a source electrode of the second semiconductor element are electrically connected to face each other in a stacking direction of the first semiconductor element and the second semiconductor element, and when the first semiconductor element group is the IGBT, an emitter electrode of the first semiconductor element and an emitter electrode of the second semiconductor element are electrically connected to face each other in the stacking direction of the first semiconductor element and the second semiconductor element, or when the first semiconductor element group is the diode, a first lead frame in which a cathode electrode of the first semiconductor element and a cathode electrode of the second semiconductor element are electrically connected to face each other in the stacking direction of the first semiconductor element and the second semiconductor element is included in the first semiconductor package, the first lead frame is positioned between the first semiconductor element and the second semiconductor element, the second semiconductor element group is a MOSFET or an IGBT, when the second semiconductor element group is the MOSFET, a source electrode of the fourth semiconductor element and a source electrode of the fifth semiconductor element are electrically connected to face each other, or when the second semiconductor element group is the IGBT, a second lead frame in which an emitter electrode of the fourth semiconductor element and an emitter electrode of the fifth semiconductor element are electrically connected to face each other is included in the second semiconductor package, the second lead frame is positioned between the fourth semiconductor element and the fifth semiconductor element, the second semiconductor package includes a second common terminal connected to the second lead frame, and the second common terminal is electrically connected to a low potential side input terminal of the primary-side circuit.

6. The semiconductor device according to claim 5, wherein a sixth semiconductor element is optionally included in the second semiconductor package, the sixth semiconductor element is included in the second semiconductor element group, when the second semiconductor element group is the MOSFET, a source electrode of the sixth semiconductor element is electrically connected to the second common terminal, and when the second semiconductor element group is the IGBT, the sixth semiconductor element is the IGBT and an emitter electrode of the sixth semiconductor element is electrically connected to the second common terminal.

7. The semiconductor device according to claim 5, further comprising a third semiconductor package in which a third semiconductor element group including a seventh semiconductor element and an eighth semiconductor element is accommodated in the primary-side circuit, wherein the second semiconductor element group and the third semiconductor element group are MOSFETs or IGBTs, a third lead frame in which a collector electrode of the seventh semiconductor element and a collector electrode of the eighth semiconductor element are electrically connected to face each other, or a collector electrode of the seventh semiconductor element and a collector electrode of the eighth semiconductor element are electrically connected to face each other is included in the third semiconductor package, the third lead frame is positioned between the seventh semiconductor element and the eighth semiconductor element, and the third semiconductor package includes a third common terminal connected to the third lead frame, and the third common terminal is electrically connected to a high potential side input terminal of the primary-side circuit.

* * * * *